(12) United States Patent
Lin et al.

(10) Patent No.: US 12,193,239 B2
(45) Date of Patent: Jan. 7, 2025

(54) SEMICONDUCTOR MEMORY DEVICE AND METHOD FOR MANUFACTURING THE SAME

(71) Applicant: TAIWAN SEMICONDUCTOR MANUFACTURING COMPANY, LTD., Hsinchu (TW)

(72) Inventors: Meng-Han Lin, Hsinchu (TW); Chia-En Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 269 days.

(21) Appl. No.: 17/716,517

(22) Filed: Apr. 8, 2022

(65) Prior Publication Data

US 2023/0328995 A1    Oct. 12, 2023

(51) Int. Cl.
*H10B 51/20* (2023.01)
*H10B 51/10* (2023.01)
*H10B 51/30* (2023.01)

(52) U.S. Cl.
CPC ............. *H10B 51/20* (2023.02); *H10B 51/10* (2023.02); *H10B 51/30* (2023.02)

(58) Field of Classification Search
CPC ........ H10B 51/00; H10B 51/10; H10B 51/20; H10B 51/30
See application file for complete search history.

(56) References Cited

U.S. PATENT DOCUMENTS

| 9,698,156 B2 * | 7/2017 | Lue | H10B 43/10 |
|---|---|---|---|
| 2021/0296332 A1 * | 9/2021 | Han | H10B 41/27 |
| 2022/0037363 A1 * | 2/2022 | Jiang | H10B 51/20 |
| 2022/0399400 A1 * | 12/2022 | Takashima | H10B 63/34 |
| 2023/0023327 A1 * | 1/2023 | Nagashima | H10B 51/20 |

FOREIGN PATENT DOCUMENTS

| EP | 3843158 A1 * | 6/2021 | ....... H01L 21/02532 |
|---|---|---|---|
| WO | WO-2017091338 A1 * | 6/2017 | ......... G11C 11/5628 |

* cited by examiner

*Primary Examiner* — Matthew E Warren
(74) *Attorney, Agent, or Firm* — Birch, Stewart, Kolasch & Birch, LLP

(57) ABSTRACT

A semiconductor memory device includes pairs of metal lines and memory arrays. Each of the memory arrays includes first and second sets of thin film transistors (TFTs), a first switch transistor, and a second switch transistor. The TFTs in the first and second sets are electrically connected to each other in parallel. The first switch transistor is electrically connected in series to one of the TFTs in the first set and one of the metal lines in a corresponding one of the pairs of the metal lines. The second switch transistor is electrically connected in series to one of the TFTs in the second set and the other one of the metal lines in the corresponding one of the pairs of the metal lines.

20 Claims, 33 Drawing Sheets

SEMICONDUCTOR MEMORY DEVICE AND METHOD FOR MANUFACTURING THE SAME

BACKGROUND

Semiconductor memory devices have been widely used in a variety of electronic products, such as computers, portable devices, automotive parts, and internet of things (IoT). Currently, a memory array of a semiconductor memory device tends to have a three-dimensional (3D) architecture instead of a two-dimensional (2D) architecture, so that the memory capacity of the semiconductor memory device can be effectively increased with a relatively small area penalty.

However, a high resistive-capacitive (RC) delay might be induced within the memory array because of a high capacitance present between a local source line/bit line (SL/BL) and a word line (WL), which adversely affects the reading speed of the semiconductor memory device. Therefore, there is a need to reduce the RC delay within the memory array of the semiconductor memory device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
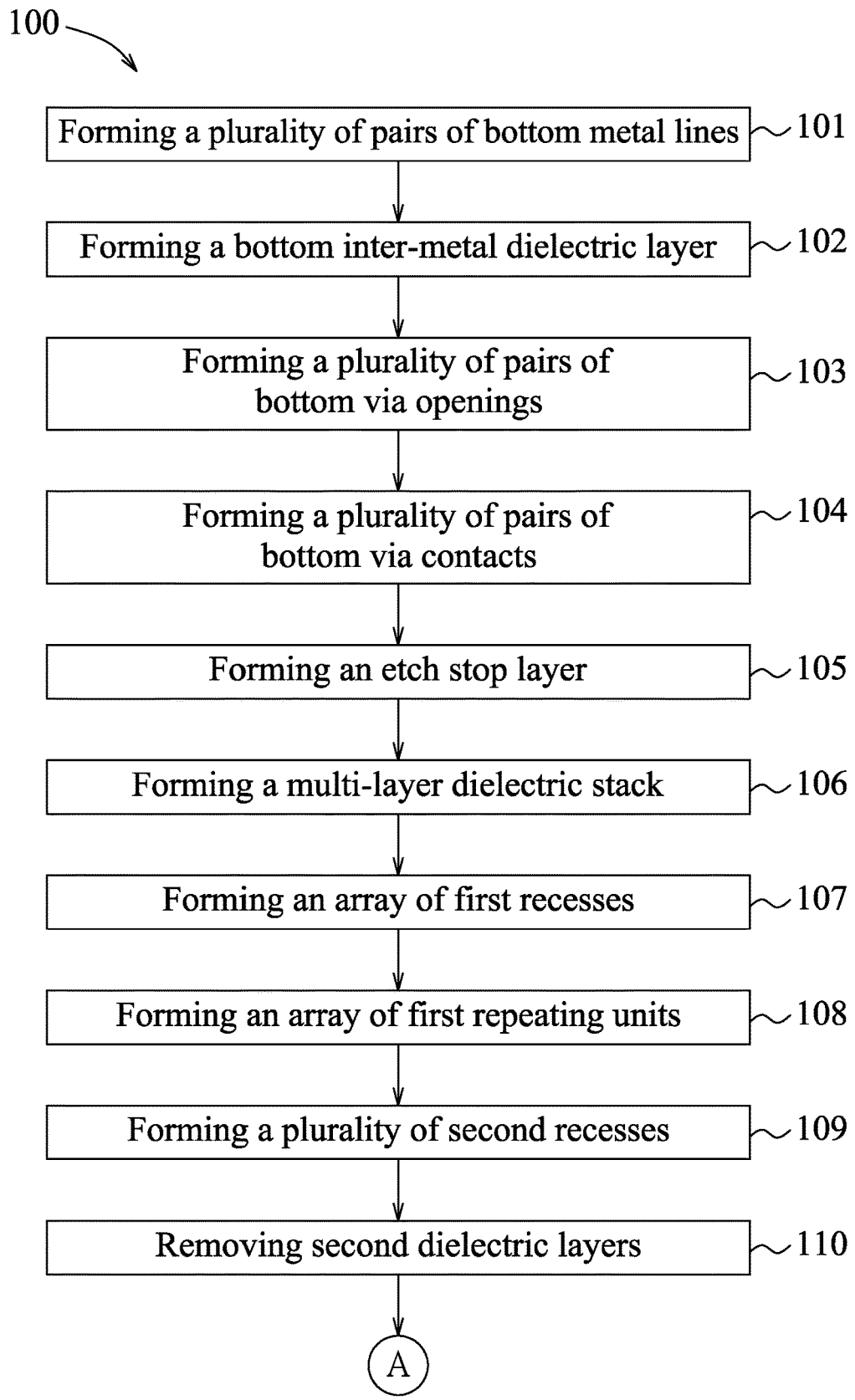
FIGS. 1A and 1B are flow diagrams illustrating a method for manufacturing a semiconductor memory device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "above," "below," "proximate," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
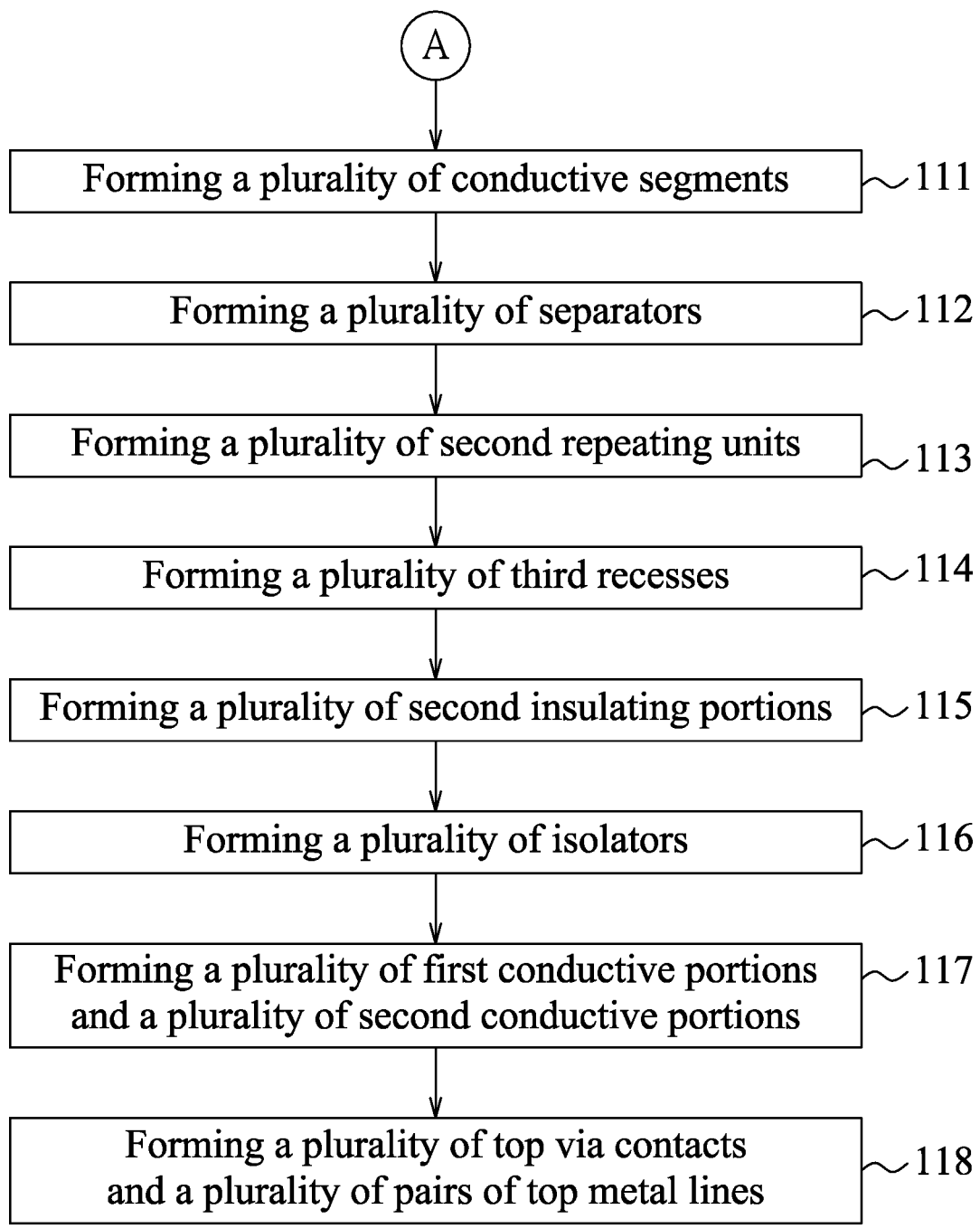

The present disclosure is directed to a semiconductor device and a method for manufacturing the same. FIGS. 1A and 1B are flow diagrams illustrating a method 100 for manufacturing a semiconductor memory device (for example, a semiconductor memory device 200 shown in FIG. 19A) in accordance with some embodiments. FIGS. 2 to 19C illustrate schematic views of the intermediate stages of the method 100. In some embodiments, the semiconductor memory device 200 includes a three-dimensional (3D) memory structure 1, a plurality of top via contacts 2, and a plurality of pairs of top metal lines 31, 32.

Figure 2:
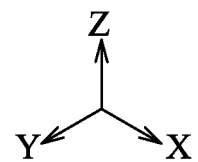
FIGS. 2 to 19C are schematic views illustrating intermediate stages of the method for manufacturing the semiconductor memory device in accordance with some embodiments.
Figure 2:
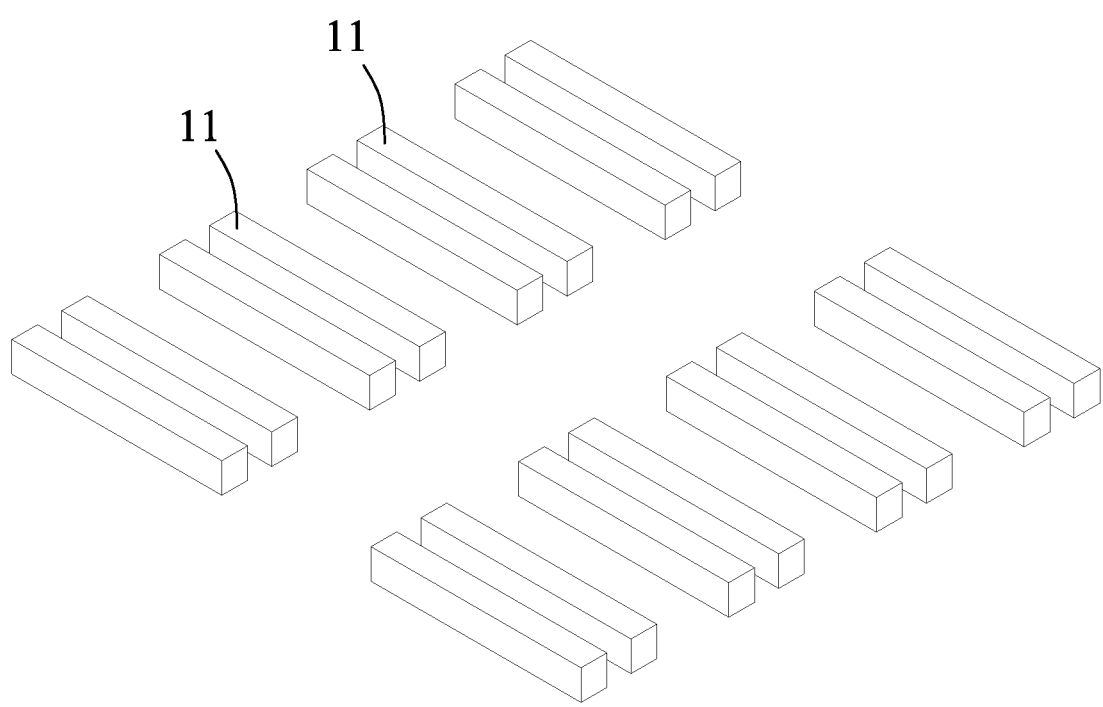

Referring to FIGS. 1A and 2, the method 100 begins at step 101, where a plurality of pairs of bottom metal lines 11 are formed on conductive features (not shown) of a semiconductor structure (not shown). The bottom metal lines 11 in each pair extend in an X direction, and are spaced apart from each other in a Y direction transverse to the X direction. In some embodiments, formation of the bottom metal lines 11 includes the following steps. First, an interlayer dielectric (ILD) layer (not shown) is deposited on the semiconductor structure, and then a plurality of through holes (not shown) are formed through the ILD layer to expose the conductive features from the through holes. Afterward, the bottom metal lines 11 are formed by depositing a metal material to fill the through holes and then removing excess of the metal material above the ILD layer by a planarization process, such as chemical mechanical planarization (CMP). In some embodiments, the pairs of the bottom metal lines 11 may include, for example, but not limited to, copper (Cu), ruthenium (Ru), cobalt (Co), molybdenum (Mo), tungsten (W), nickel (Ni), iridium (Ir), rhodium (Rh), osmium (Os), and the like, or combinations thereof. The pairs of the bottom metal lines 11 may be formed by a suitable deposition process, for example, but not limited to, chemical vapor deposition (CVD), plasma-enhanced CVD (PECVD), atomic layer deposition (ALD), plasma-enhanced ALD (PEALD), or other suitable deposition processes.

Figure 3:
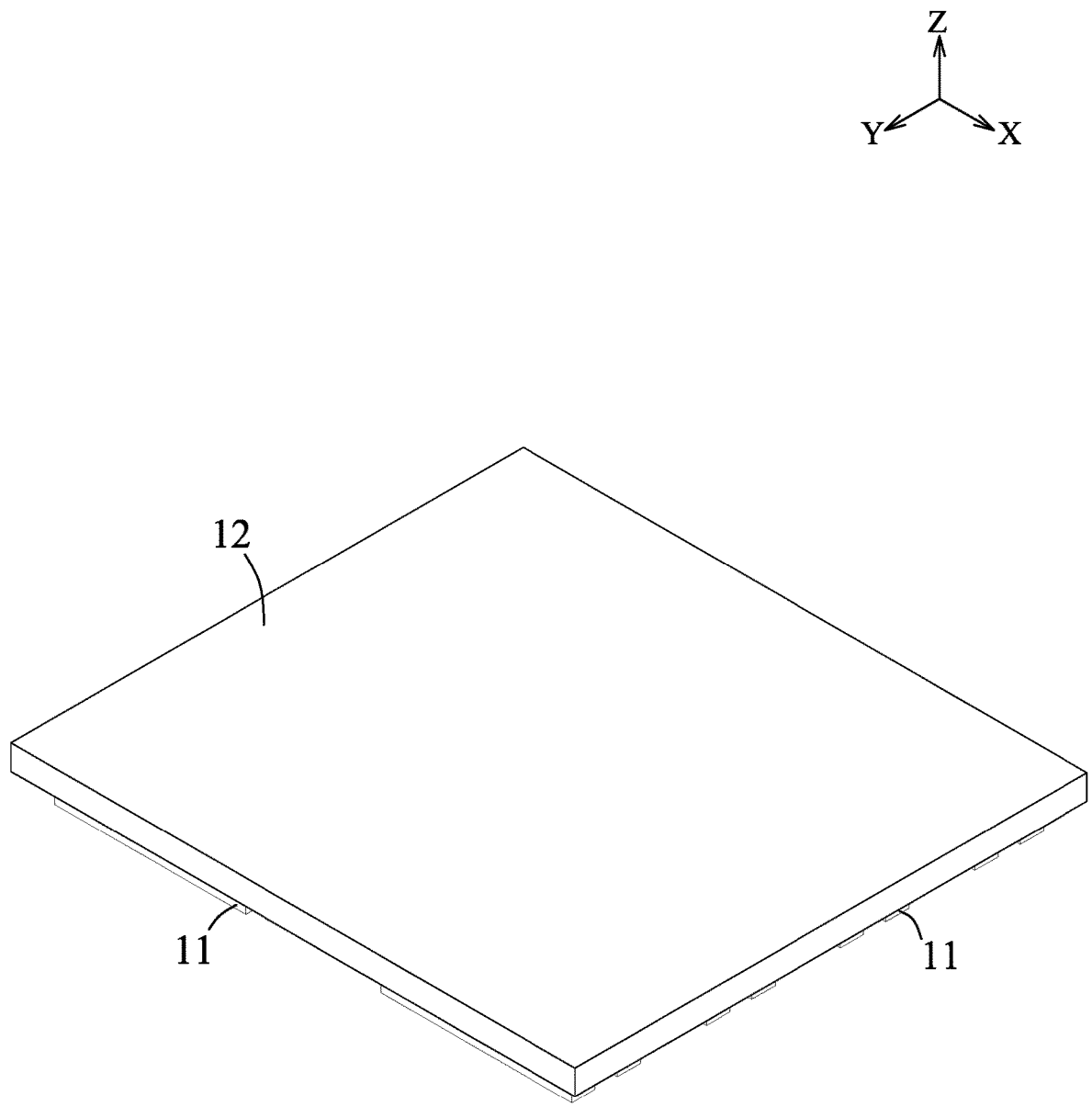

Referring to FIGS. 1A and 3, the method 100 then proceeds to step 102, where a bottom inter-metal dielectric (IMD) layer 12 is formed on the bottom metal lines 11. The bottom IMD layer 12 may be made of, for example, but not limited to, boro-silicate glass (BSG), boron-doped phospho-silicate glass (BPSG), phospho-silicate glass (PSG), undoped silicate glass (USG), or the like. Other suitable materials for the bottom IMD layer 12 are within the contemplated scope of the present disclosure. The bottom IMD layer 12 may be formed by a suitable deposition process, for example, but not limited to, CVD, PECVD, or other suitable deposition processes.

Figure 4:
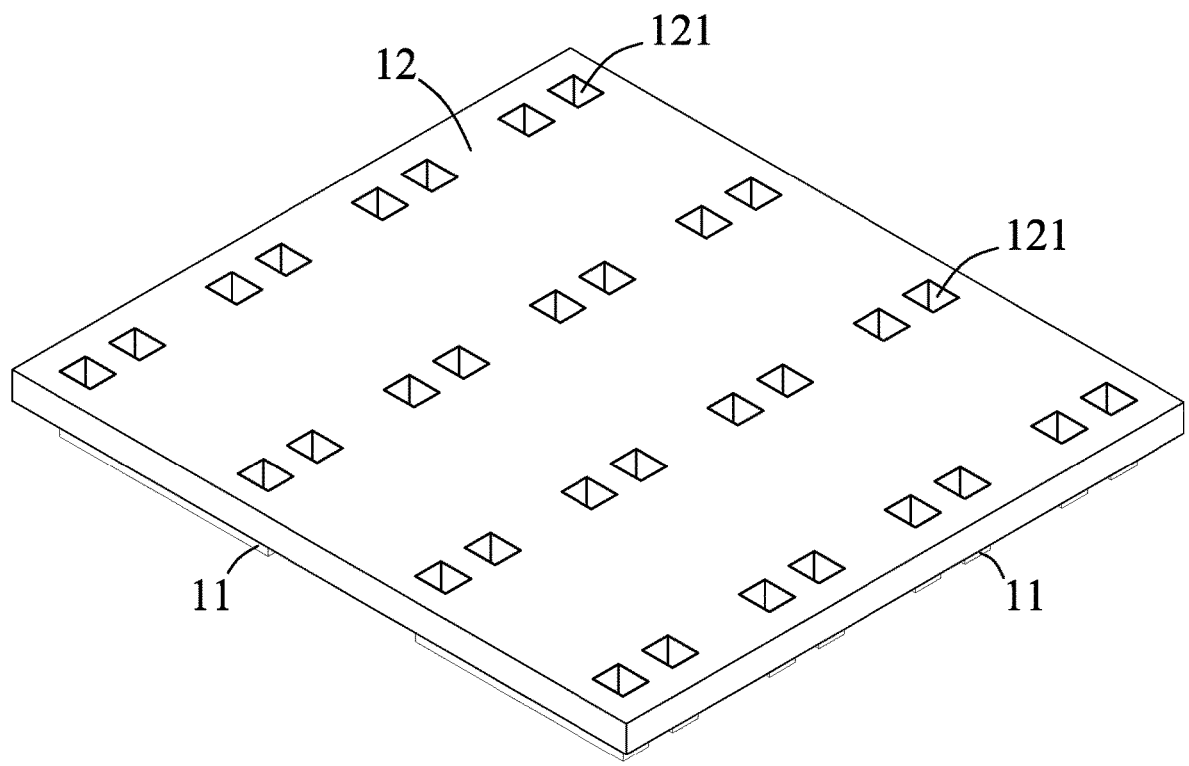

Referring to FIGS. 1A and 4, the method 100 then proceeds to step 103, where a plurality of pairs of bottom via openings 121 are formed in the bottom IMD layer 12. Step 103 may include the following steps. First, a hard mask is formed on the bottom IMD layer 12 by a suitable fabrication process, for example, but not limited to, CVD, physical vapor deposition (PVD), ALD, PECVD, or other suitable fabrication processes. A photoresist layer is then formed on the hard mask by a suitable fabrication process, for example, but not limited to, spin-on coating. The photoresist layer is then patterned by a suitable photolithography process to form a pattern of holes arranged in position corresponding to the pairs of the bottom via openings 121 to be formed. For example, the photoresist layer is exposed to light for patterning, followed by developing to form the pattern of the holes. The pattern of the holes formed in the photoresist layer is transferred to the hard mask by a suitable etching process, for example, but not limited to, a wet etching process, a dry etching process, a reactive ion etching process, a neutral beam etching process, or the like. Afterward, the photoresist layer may be removed by, for example, but not limited to, an ashing process. The pattern of the holes formed in the hard mask is then transferred to the bottom IMD layer 12 by a suitable etching process, for example, but not limited to, a wet etching process, a dry etching process, a reactive ion etching process, a neutral beam etching process, or the like, so as to form the bottom via openings 121 extending through the bottom IMD layer 12. Thereafter, the hard mask may be removed by a suitable process, for example, but not limited to, a wet etching process, a dry etching process, a planarization process, or the like.

Figure 5:
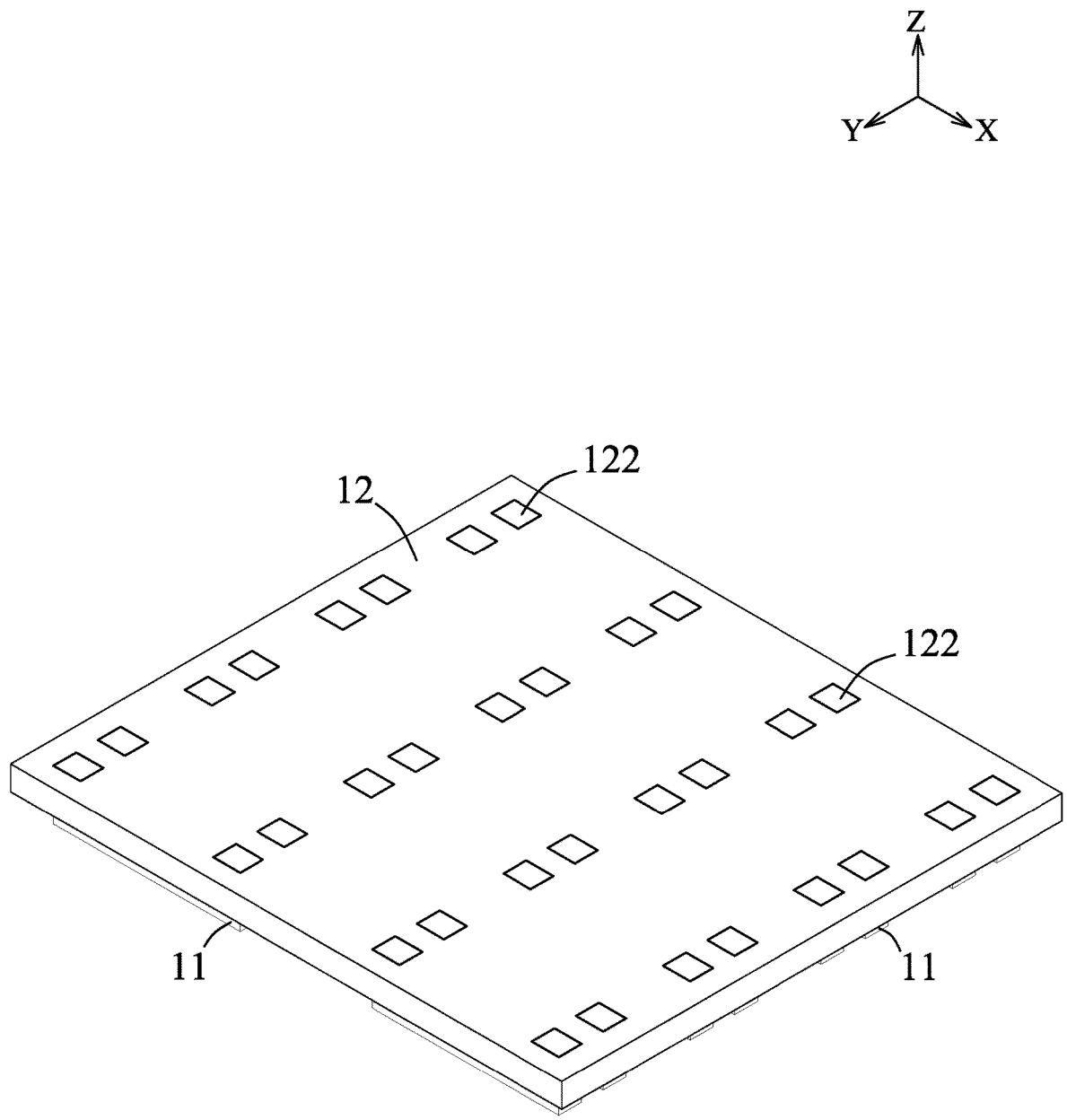

Referring to FIGS. 1A and 5, the method 100 then proceeds to step 104, where a plurality of pairs of bottom via contacts 122 are formed in the bottom IMD layer 12. Step 104 may include (i) forming a metallic material on a top surface of the bottom IMD layer 12 and in the pairs of the bottom via openings 121 (see FIG. 4), and then (ii) removing excess of the metallic material on the top surface of the bottom IMD layer 12 by a planarization process, for example, but not limited to, CMP. In some embodiments, the metallic material for the pairs of the bottom via contacts 122 may include, for example, but not limited to, copper (Cu), ruthenium (Ru), cobalt (Co), molybdenum (Mo), tungsten (W), nickel (Ni), iridium (Ir), rhodium (Rh), osmium (Os), and the like, or combinations thereof. Other suitable materials for the pairs of the bottom via contacts 122 are within the contemplated scope of the present disclosure. In some embodiments, the step (i) may be formed by a suitable deposition process, for example, but not limited to, CVD, PECVD, ALD, PEALD, or other suitable deposition processes.

Figure 6:
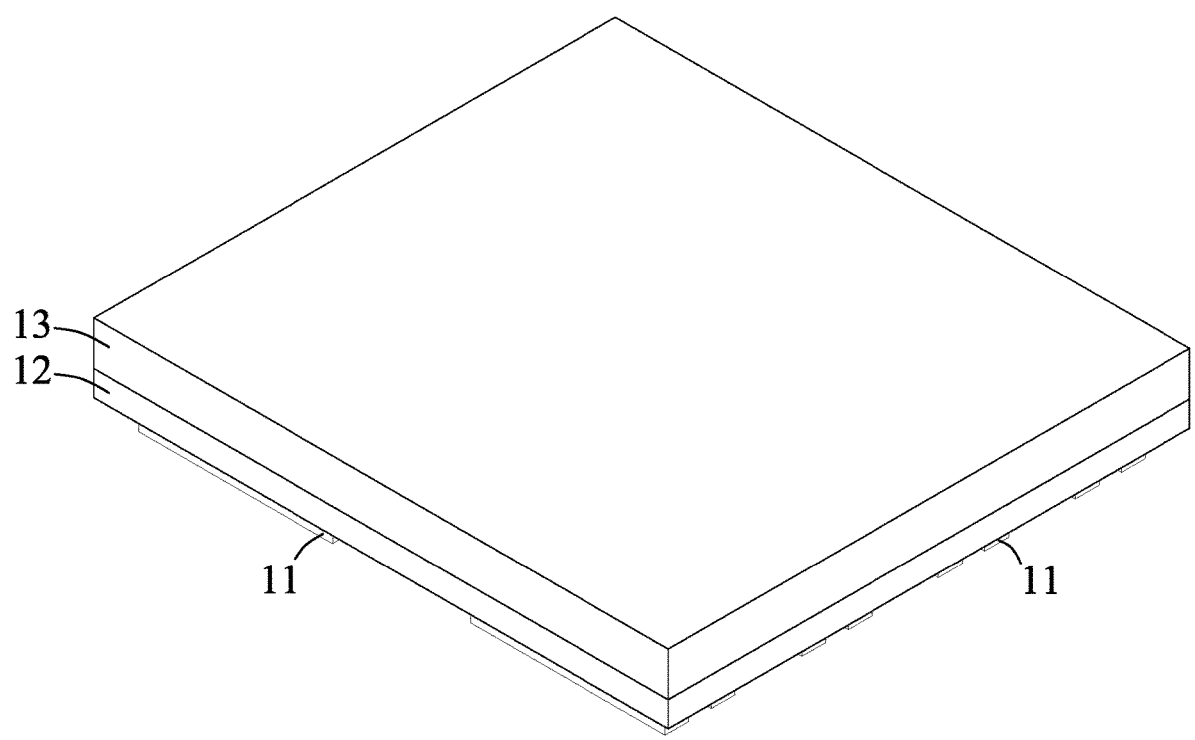

Referring to FIGS. 1A and 6, the method 100 then proceeds to step 105, where an etch stop layer 13 is formed on the bottom IMD layer 12. The etch stop layer 13 may be made of a dielectric material, for example, but not limited to, silicon nitride, silicon nitride doped with carbon, silicon oxide, silicon oxynitride, silicon oxynitride doped with carbon, amorphous carbon material, silicon carbide, other nitride materials, other carbide materials, aluminum oxide, other oxide materials, other metal oxides, boron nitride, boron carbide, and other low-k dielectric materials or low-k dielectric materials doped with one or more of carbon, nitrogen, and hydrogen, or other suitable materials. The etch stop layer 13 may be formed by a suitable deposition process, for example, but not limited to, CVD, PVD, ALD, PECVD, or other suitable deposition processes.

Figure 7:
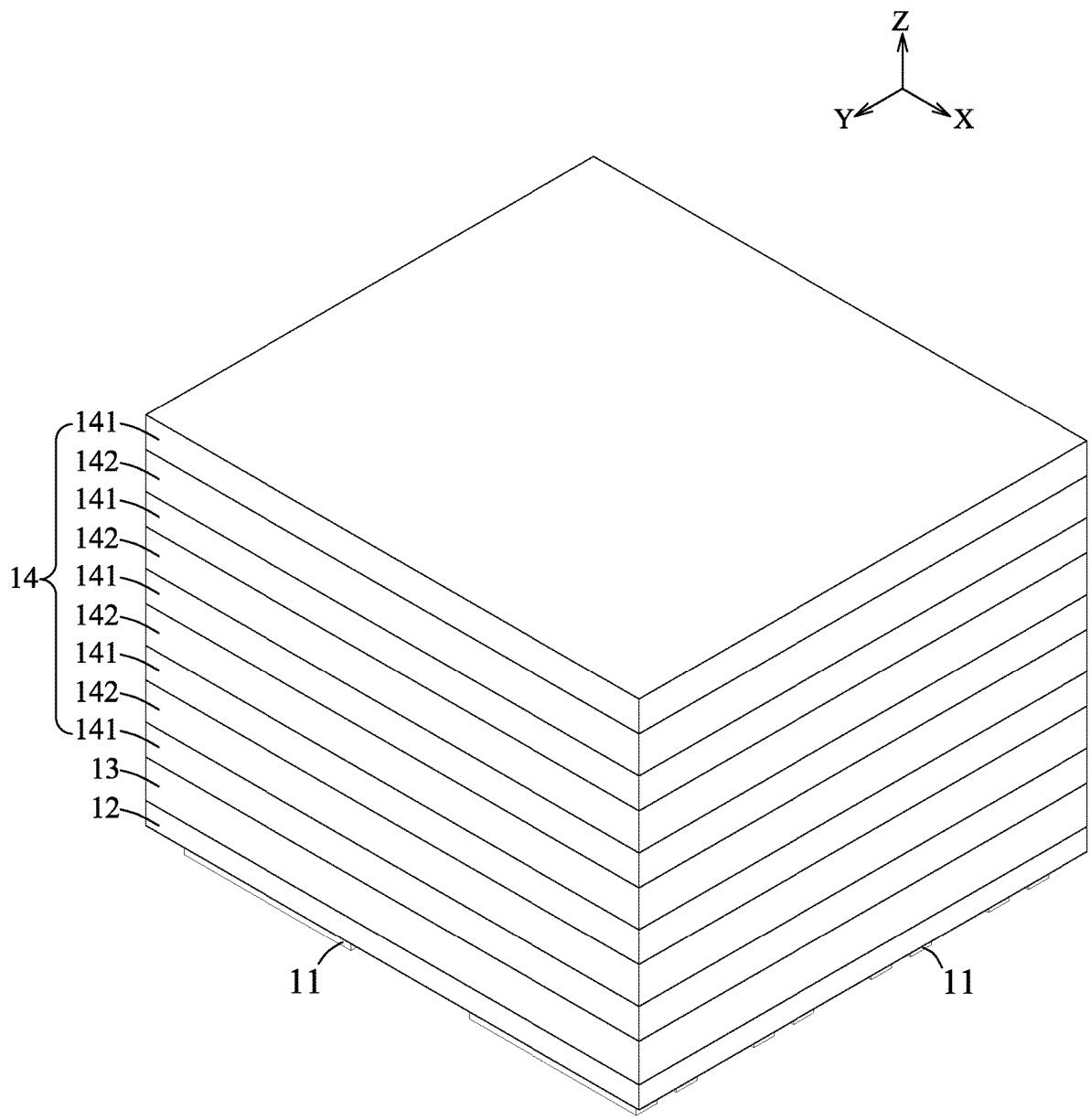

Referring to FIGS. 1A and 7, the method 100 then proceeds to step 106, where a multi-layer dielectric stack 14 is formed on the etch stop layer 13 opposite to the bottom IMD layer 12. The multi-layer dielectric stack 14 includes a plurality of first dielectric layers 141 and a plurality of second dielectric layers 142, which are alternately stacked on the etch stop layer 13 in a Z direction (e.g., stacking direction) transverse to the X direction and the Y direction. The first dielectric layers 141 and the second dielectric layers 142 may be formed by a suitable deposition process, for example, but not limited to, CVD, PVD, ALD, or other suitable deposition processes. Each of the first and second dielectric layers 141, 142 may have a thickness ranging from about 10 nm to about 100 nm. In some embodiments, the second dielectric layers 141 may be made of a material that has a high etching selectivity with respect to the first dielectric layers 141. That is, for a suitable kind of etchant, the second dielectric layers 142 can be readily etched, while the first dielectric layers 141 are left slightly etched or substantially unetched. In some embodiments, the etch stop layer 13 may be made of a material that has a low etching selectivity with respect to the first and second dielectric layers 141, 142. That is, for a suitable kind of etchant, the first and second dielectric layers 141, 142 can be readily etched, while the etch stop layer 13 is left slightly etched or substantially unetched. In some embodiments, the first dielectric layers 141 may be made of an oxide-based material (e.g., silicon oxide, etc.), the second dielectric layers 142 may be made of a nitride-based material (e.g., silicon nitride, etc.), and the etch stop layer 13 may be made of a carbide-based material (e.g., silicon carbide, etc.).

Figure 8:
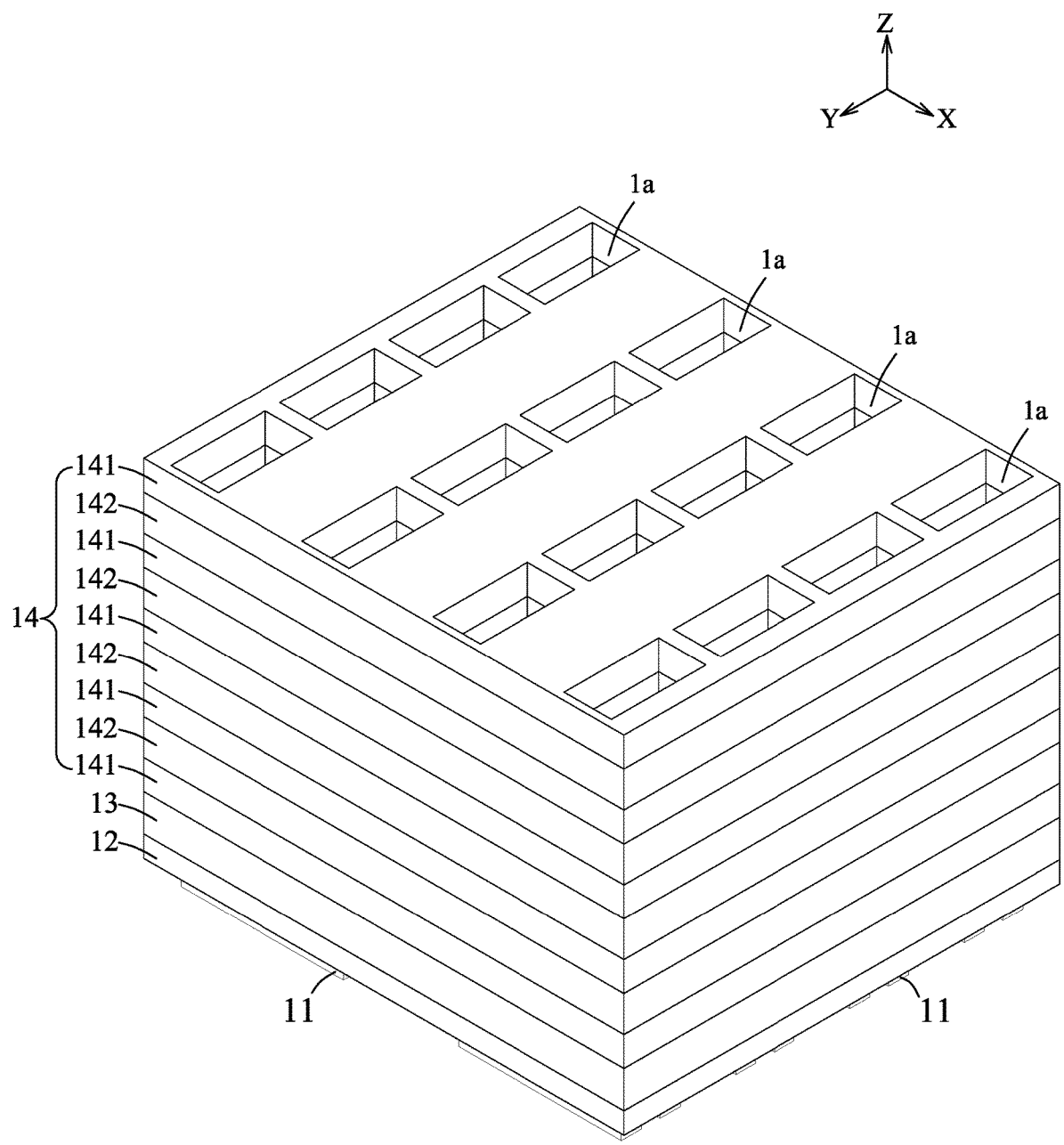

Referring to FIGS. 1A and 8, the method 100 then proceeds to step 107, where an array of first recesses 1a is formed in the multi-layer dielectric stack 14. The first recesses 1a are spaced apart from each other in the X direction and in the Y direction. The first recesses 1a penetrate through the multi-layer dielectric stack 14 and terminate at the etch stop layer 13 in the Z direction. Each of the first recesses 1a is aligned with a corresponding pair of the bottom via contacts 122. The process for forming the first recesses 1a is the same as or similar to that for forming the bottom via openings 121 as described in step 103, and thus details thereof are omitted for the sake of brevity.

Figure 9:
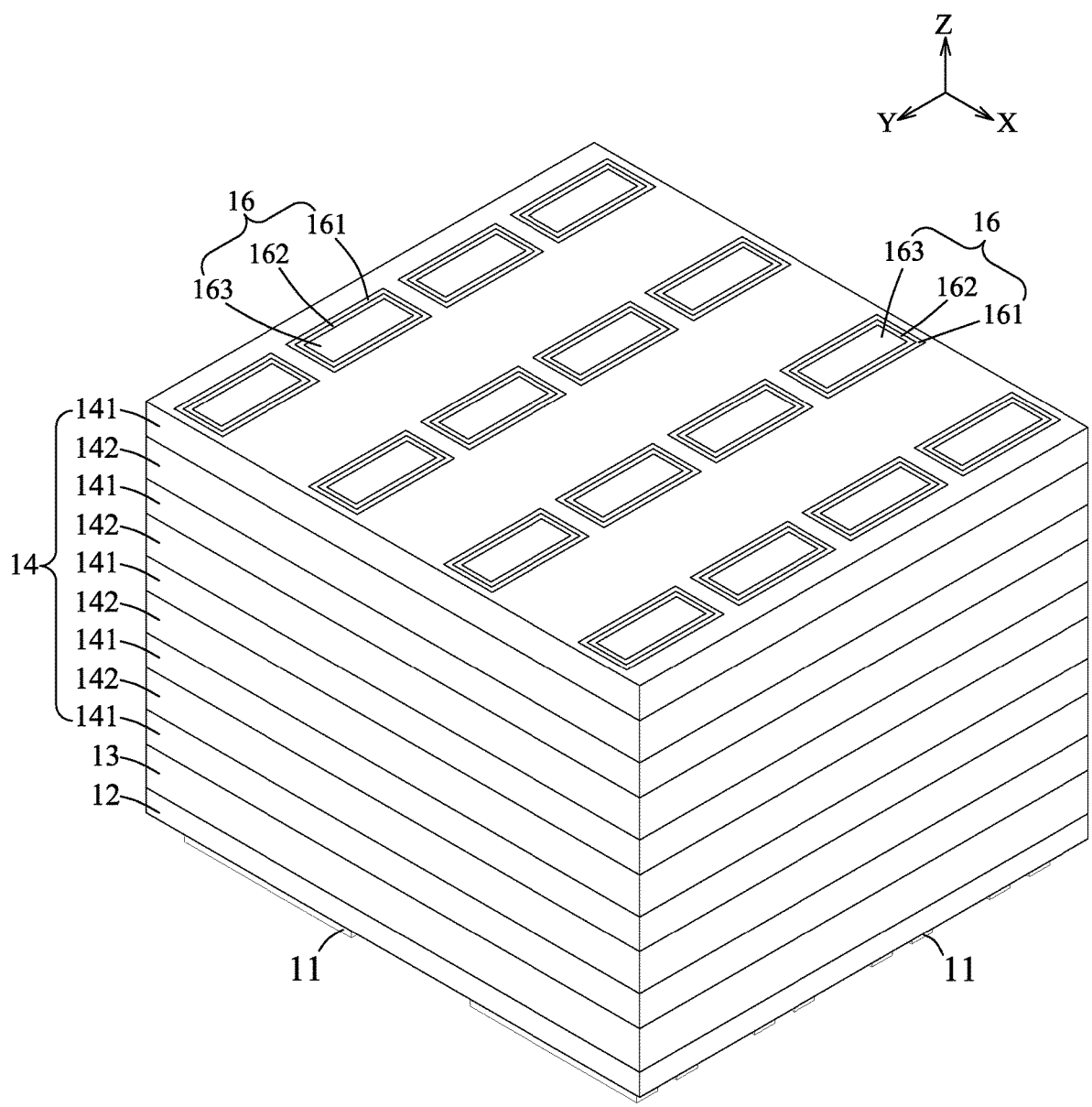

Referring to FIGS. 1A and 9, the method 100 then proceeds to step 108, where an array of first repeating units 16 is formed in the multi-layer dielectric stack 14. Each of the first repeating units 16 includes a memory portion 161, a channel portion 162 surrounded by the memory portion 161, and a first insulating portion 163 surrounded by the channel portion 162. Step 108 may include (i) sequentially and conformally depositing a memory material layer and a channel material layer on a top surface of the multi-layer dielectric stack 14 and in the first recesses 1a (see FIG. 8) by a suitable deposition process (for example, but not limited to, CVD, ALD, PVD, PECVD, or other suitable deposition processes), (ii) partially removing bottom portions of the memory material layer and the channel material layer that are conformally deposited on the etch stop layer 13 in the first recesses 1a by a suitable etching process, for example, but not limited to, anisotropic etching, (iii) depositing an insulating material layer on the channel material layer above the multi-layer dielectric stack 14 and in the first recesses 1a by a suitable deposition process (for example, but not limited to, CVD, PVD or other suitable deposition processes), and (iv) conducting a planarization process, for example, but not limited to, CMP, to remove the insulating material layer, the channel material layer and the memory material layer above the multi-layer dielectric stack 14, so as to obtain the memory portion 161, the channel portion 162, and the first insulating portion 163 of the each of the first repeating units 16.

In some embodiments, the memory material may be a high-k dielectric material. In some embodiments, the memory material may include, for example, but not limited to, a ferroelectric material, silicon nitride, silicon oxynitride, silicon oxide, or the like. The ferroelectric material may be binary oxides such as hafnium oxide (hafnia, $HfO_2$), ternary oxides such as hafnium silicate ($HfSiO_x$), hafnium zirconate (HfZrO$_x$), barium titanate (BaTiO$_3$), lead titanate (PbTiO$_3$), strontium titanate (SrTiO$_3$), calcium manganite (CaMnO$_3$), bismuth ferrite (BiFeO$_3$), or the like, or quaternary oxides such as barium strontium titanate (BaSrTiO$_x$), or the like, or combinations thereof. In some embodiments, the memory portion 161 may have a multi-layered structure. Other suitable materials for the memory portion 161 are within the contemplated scope of the present disclosure.

In some embodiments, the channel material may be a semiconductor material. In some embodiments, the channel material may include, for example, but not limited to, polysilicon, an indium-comprising material, such as In$_{x1}$Ga$_{x2}$Zn$_{x3}$M$_{x4}$O, where M may be titanium, aluminum, silver, silicon, tin, tungsten, or the like, and x1, x2, x3 and x4 may each be any value between 0 and 1, or the like, or combinations thereof. In some embodiments, the channel portion 162 may be formed as a single layer having one of the aforesaid materials. In some alternative embodiments, the channel portion 162 may be formed as a laminate structure having at least two of the aforesaid materials in various constitutions. In some embodiments, the channel portion 162 may be doped with a dopant to achieve extra stability. Other suitable materials for the channel portion 162 are within the contemplated scope of the present disclosure.

In some embodiments, the insulating material may be, for example, but not limited to, silicon oxide, silicon nitride, silicon oxynitride, silicon oxycarbide, silicon carbonitride, and combinations thereof. Other suitable materials for the first insulating portion 163 are within the contemplated scope of the present disclosure.

Figure 10:
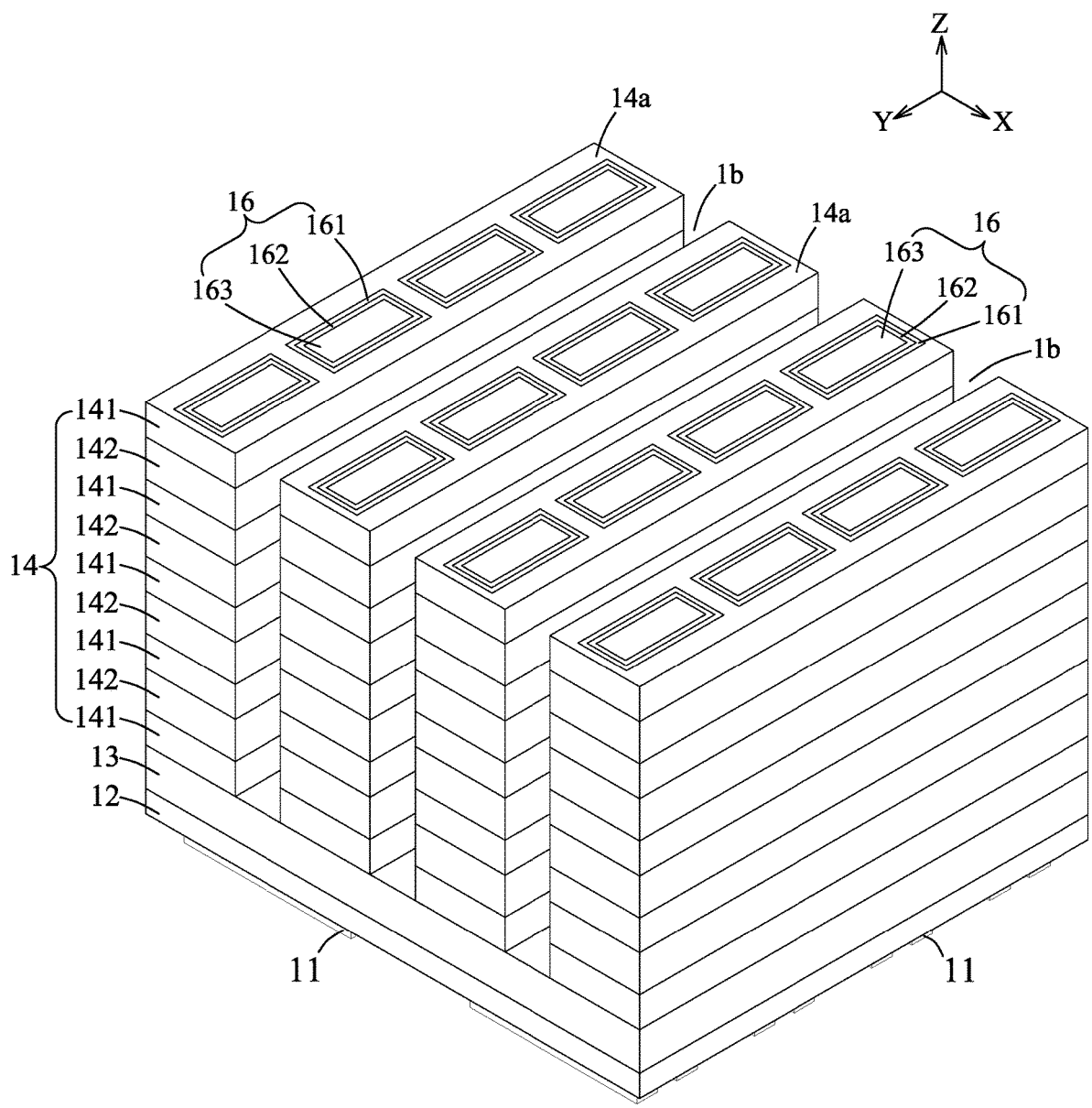

Referring to FIGS. 1A and 10, the method 100 then proceeds to step 109, where a plurality of second recesses 1b are formed to penetrate the multi-layer dielectric stack 14 and to terminate at the etch stop layer 13 so as to divide the multi-layer dielectric stack 14 into a plurality of dielectric stack regions 14a. Adjacent two of the dielectric stack regions 14a are spaced apart from each other by a corresponding one of the second recesses 1b. In this step, the second recesses 1b are formed by a suitable etching process (for example, anisotropic etching process). The anisotropic etching process may include, for example, but not limited to, anisotropic dry etching.

Figure 11:
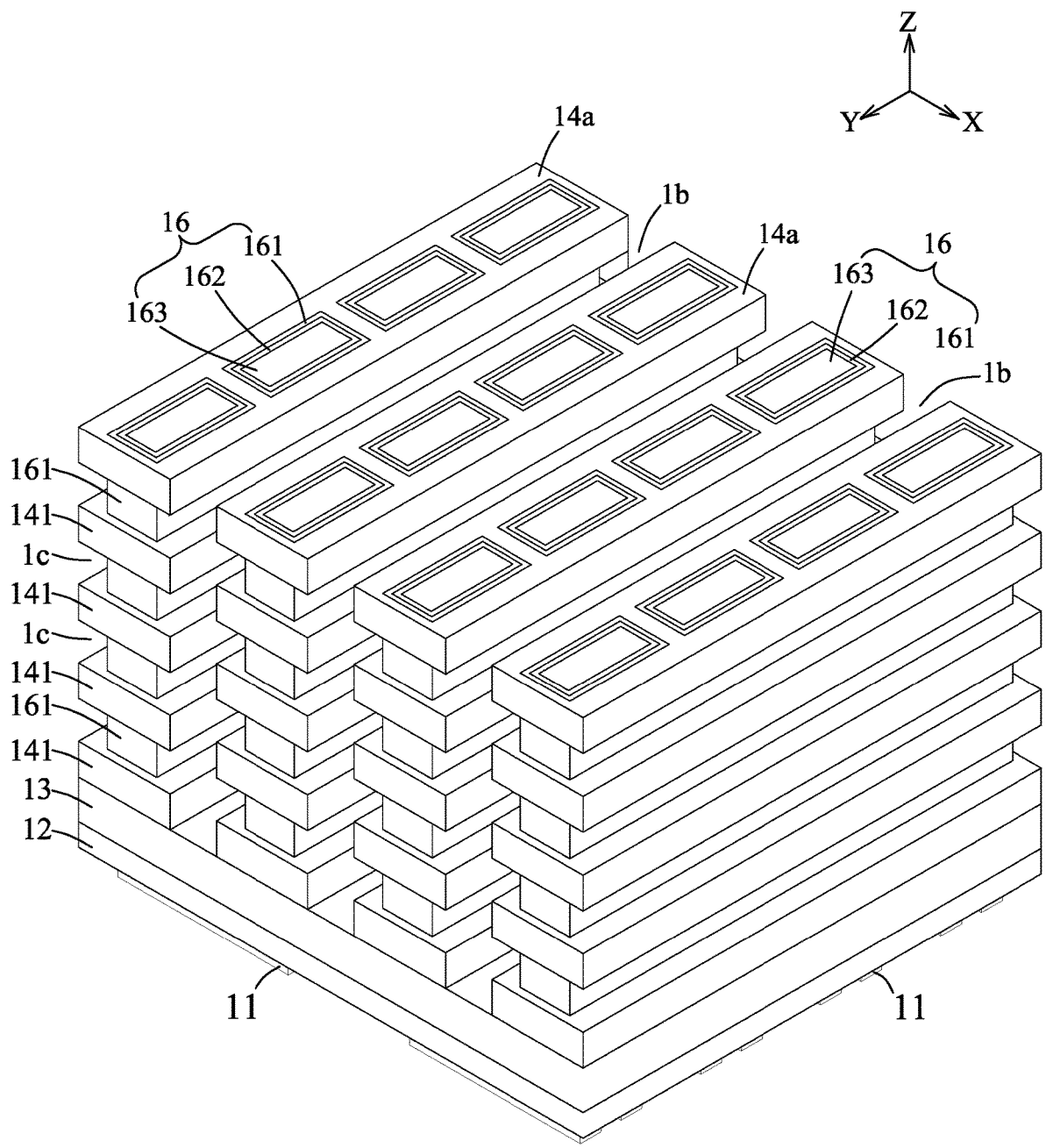

Referring to FIGS. 1A and 11, the method 100 then proceeds to step 110, where the second dielectric layers 142 are removed. In this step, the second dielectric layers 142 are removed by a suitable etching process (for example, but not limited to, isotropic etching process) based on a relatively high etching selectivity of the second dielectric layers 142 with respect to the first dielectric layers 141. After step 110, a space 1c are formed between each adjacent two of the first dielectric layers 141, and the memory portions 161 are exposed from the spaces 1c.

Figure 12:
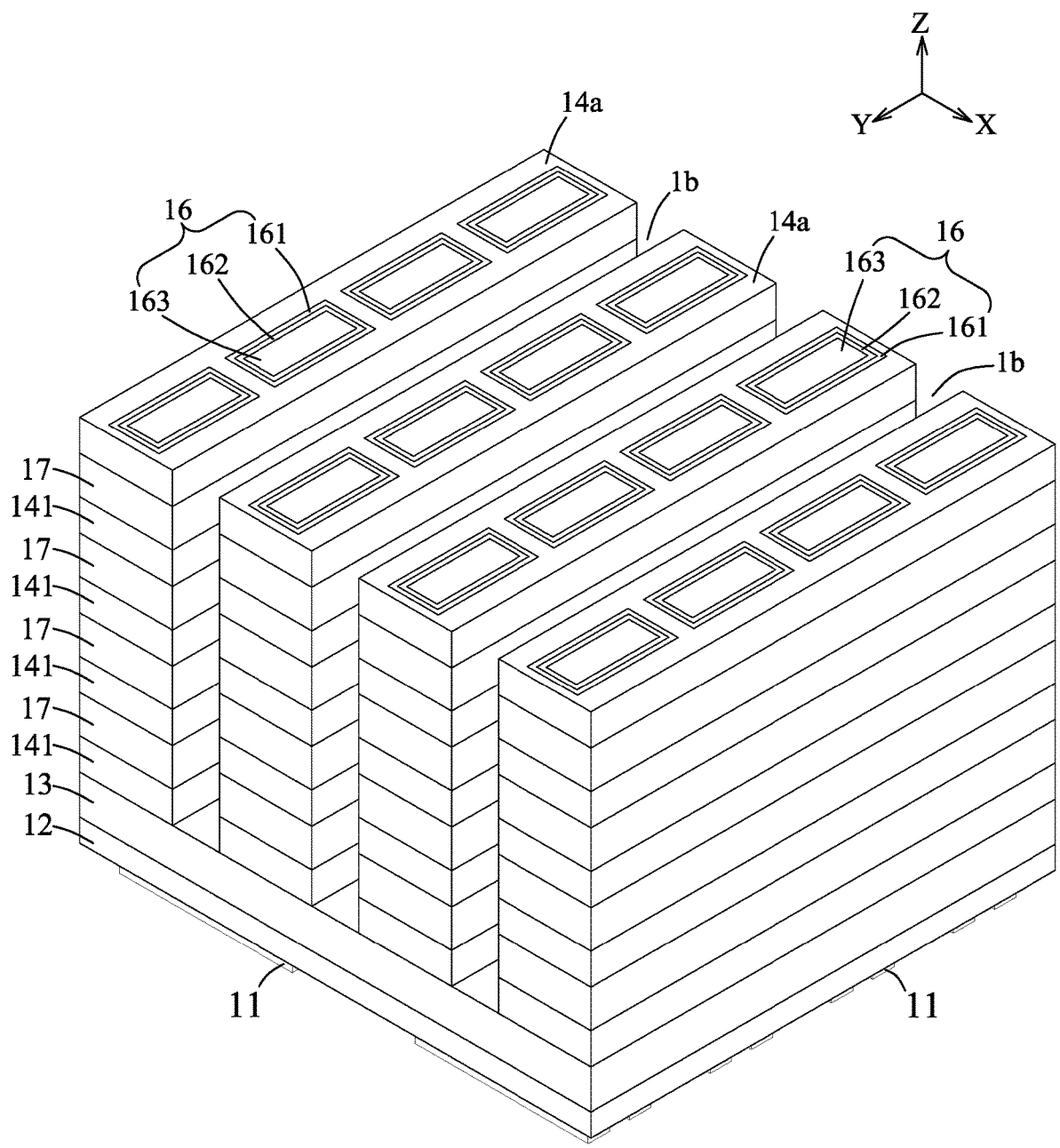

Referring to FIGS. 1B and 12, the method 100 then proceeds to step 111, where a plurality of conductive segments 17 are formed. Step 111 may include (i) forming a conductive material layer on the structure shown in FIG. 11 by a suitable deposition process, (for example, but not limited to, CVD, PVD or other suitable deposition processes), so as to fill the second recesses 1b and the spaces 1c (see FIG. 11), (ii) conducting a planarization process (for example, but not limited to, CMP) to remove the conductive material layer above the dielectric stack regions 14a, and then (iii) etching back the conductive material layer filled in the second recesses 1b by an anisotropic etching process, so as to obtain the conductive segments 17 formed in the spaces 1c, respectively. The conductive material layer for the conductive segments 17 may include, for example, but not limited to, tantalum nitride, tungsten, titanium nitride, combinations thereof, or other suitable conductive materials. After step 111, each of the conductive segments 17 surrounds corresponding ones of the memory portions 161. The first dielectric layers 141 and the conductive segments 17 are alternately arranged in the Z direction to form a stack structure.

Figure 13A:
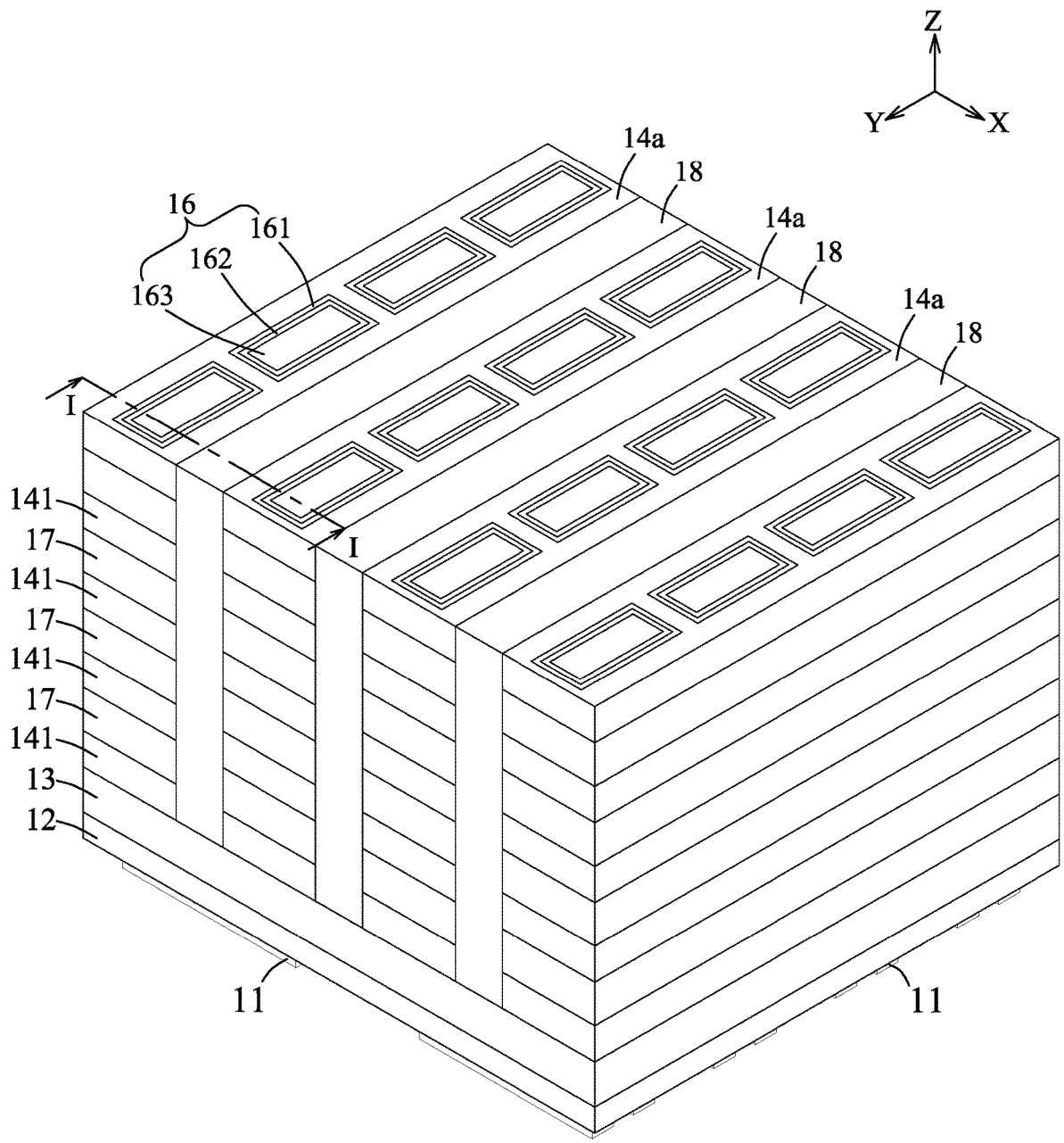
Figure 13B:
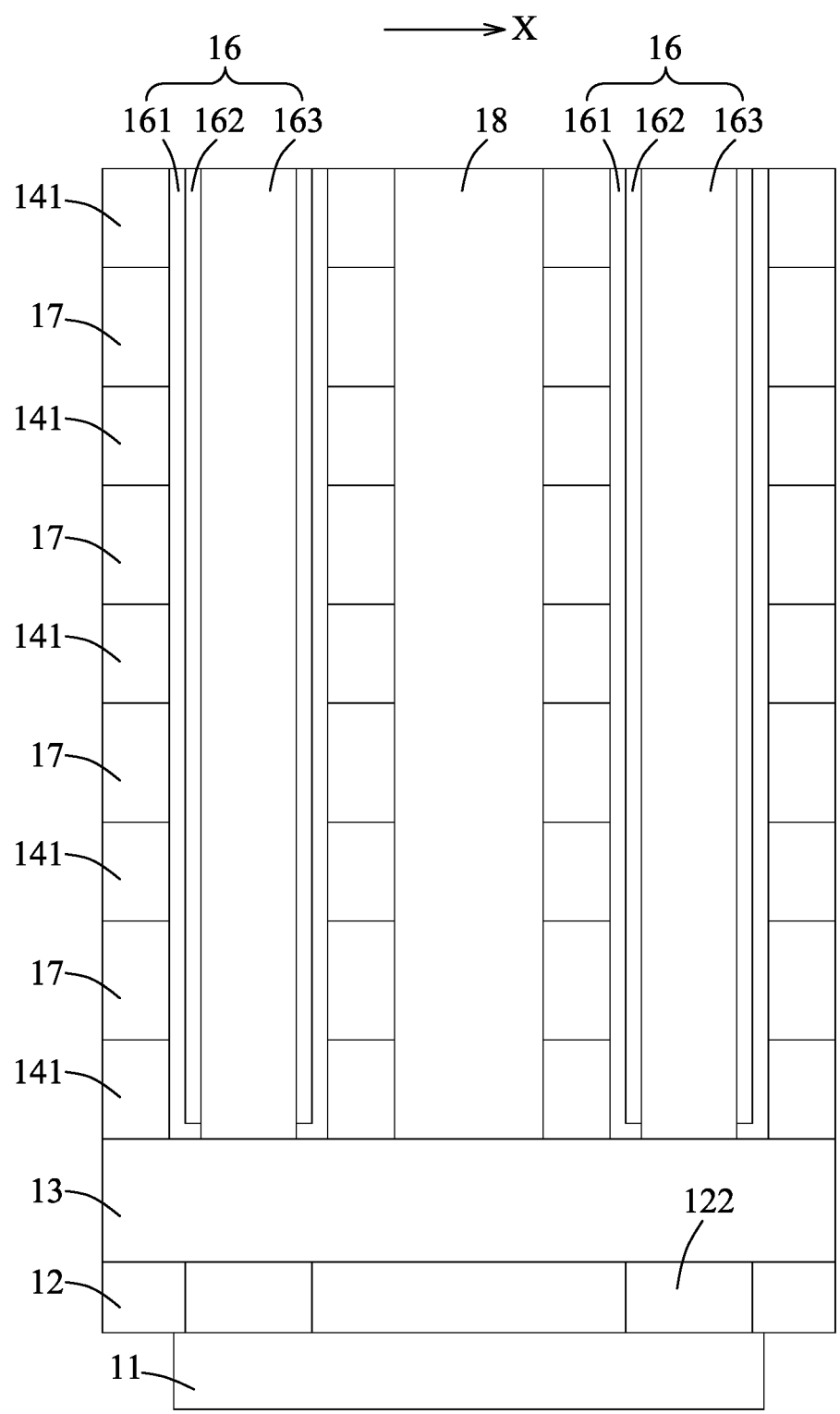

Referring to FIGS. 1B, 13A and 13B, the method 100 then proceeds to step 112, where a plurality of separators 18 are formed in the second recesses 1b (see FIG. 12), respectively. FIG. 13B illustrates a fragmentary cross-sectional view taken along line I-I of FIG. 13A. The separators 18 may include, for example, but not limited to, silicon oxide, silicon nitride, silicon oxynitride, silicon oxycarbide, silicon carbonitride, and combinations thereof. Other suitable materials for the separators 18 are within the contemplated scope of the present disclosure. Step 112 may include (i) forming a material layer for the separators 18 over the structure shown in FIG. 12 and in the second recesses 1b by a suitable deposition process (for example, but not limited to, CVD, PVD or other suitable deposition processes), and then (ii) conducting a planarization process (for example, but not limited to, CMP) to remove the material layer above the dielectric stack regions 14a, so as to obtain the separators 18.

Figure 14A:
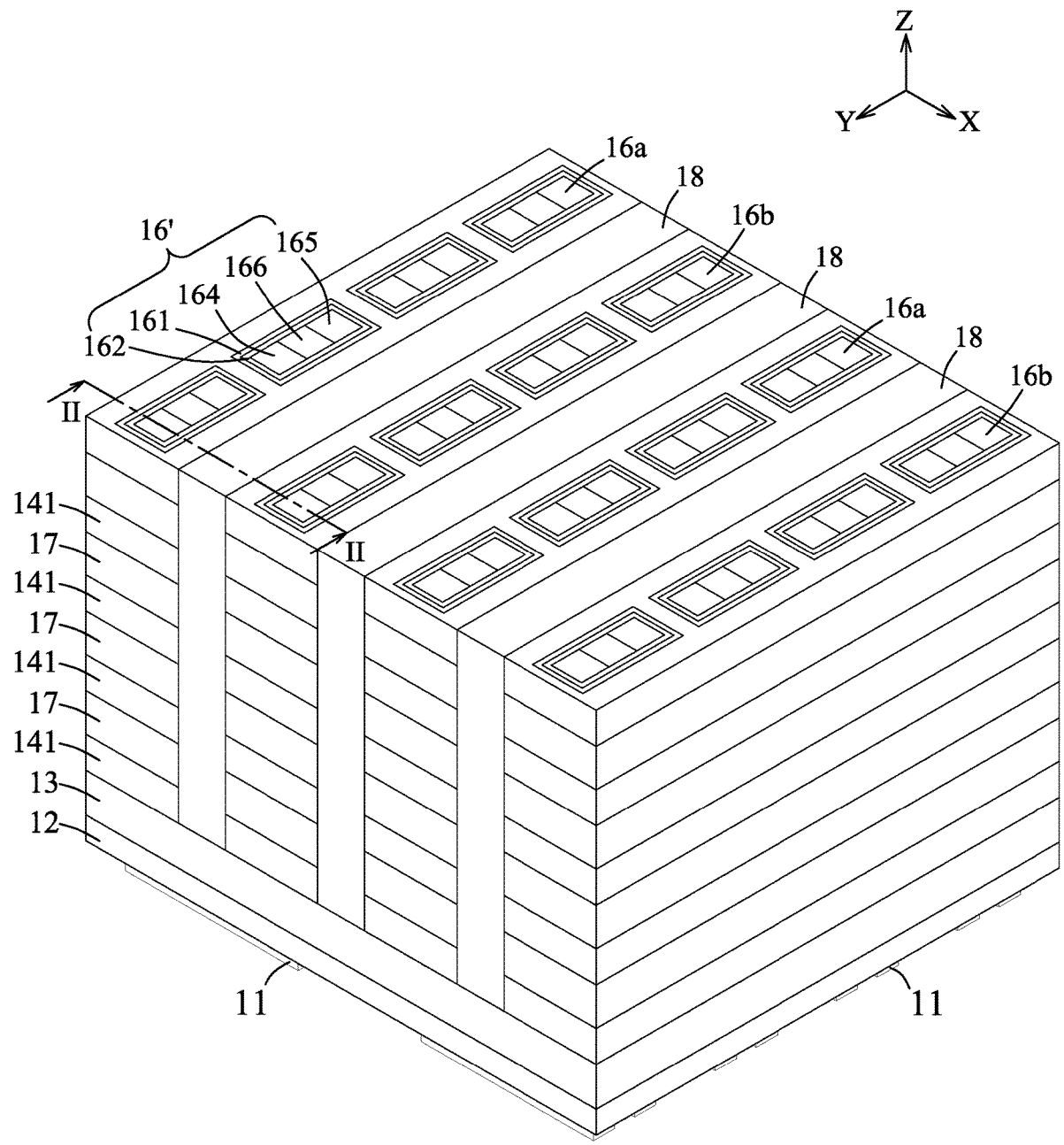
Figure 14B:
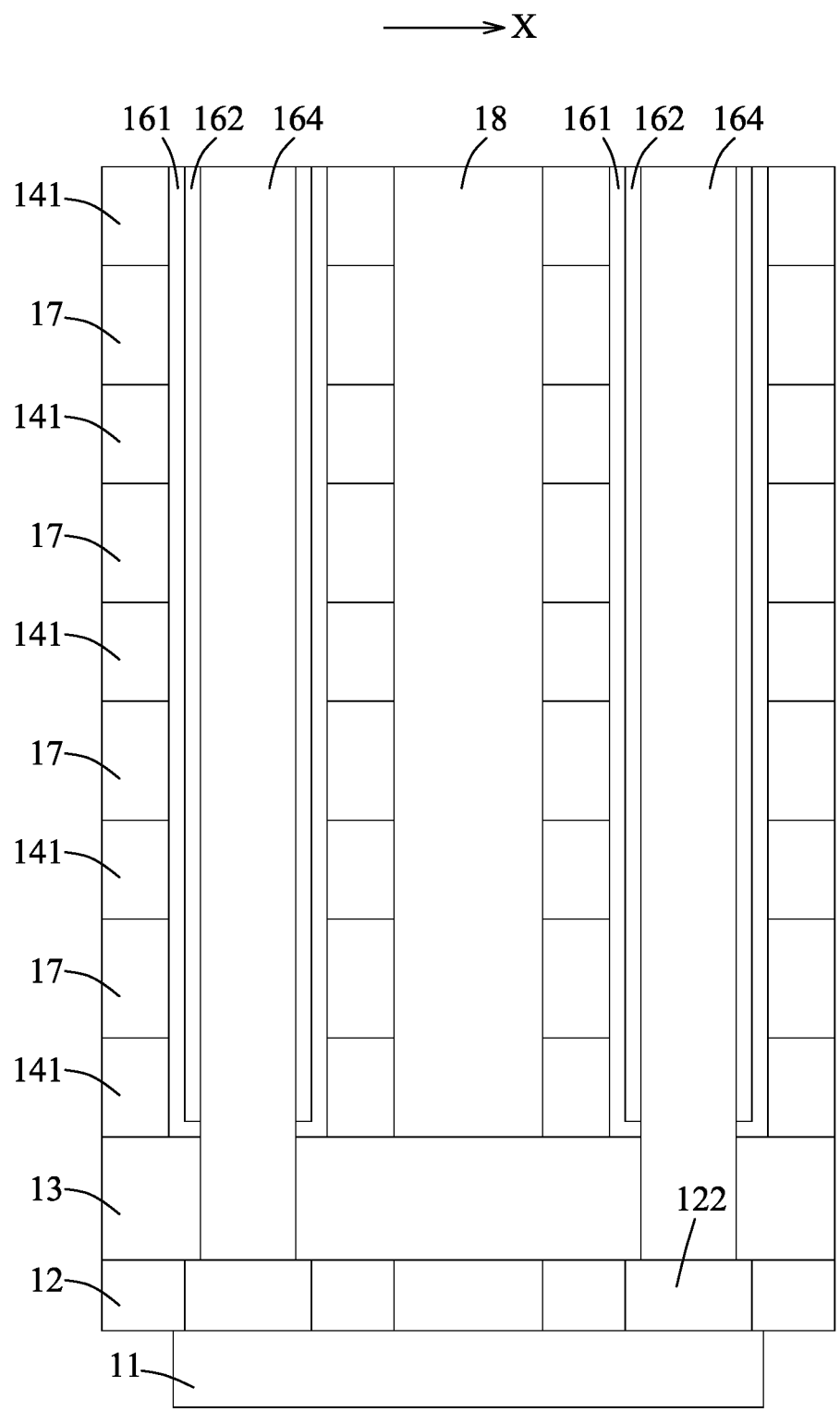

Referring to FIGS. 1B, 14A and 14B, the method 100 then proceeds to step 113, where a plurality of second repeating units 16' are formed. FIG. 14B illustrates a fragmentary cross-sectional view taken along line II-II of FIG. 14A. Each of the second repeating units 16' includes the memory portion 161, the channel portion 162, a first conductive pillar 164, a second conductive pillar 165 and an isolation pillar 166, in which the first conductive pillar 164, the second conductive pillar 165 and the isolation pillar 166 are surrounded by the channel portion 162. Step 113 may include (i) patterning the structure shown in FIG. 13A by a photolithography process, so as to form the first insulating portion 163 of each of the first repeating units 16 (see FIG. 13A) into the isolation pillar 166 and two through holes (not shown) which are isolated from each other by the isolation pillar 166 and each of which extends through the first insulating portion 163 and the etch stop layer 13 to terminate at a corresponding one of the bottom via contacts 122, (ii) forming a conductive material layer in the through holes and over the patterned structure shown in FIG. 13A by a suitable deposition process (for example, CVD, PVD or other suitable deposition processes), so as to fill the through holes, and then (iii) conducting a planarization process (for example, but not limited to, CMP) to remove the conductive material layer above the patterned structure shown in FIG. 13A, so as to form the first and second conductive pillars 164, 165, thereby obtaining the second repeating units 16' which extend through the stack structure. In each of the second repeating units 16', the first and second conductive pillars 164, 165 are isolated from each other by the isolation pillar 166 in the Y direction. The conductive material layer for the first and second conductive pillars 164, 165 may include, for example, but not limited to, titanium nitride, tungsten, a combination thereof, or other suitable conductive materials. In each of the second repeating units 16', the first and second conductive pillars 164, 165 are disposed on and are electrically connected to the corresponding ones of the bottom via contacts 122, respectively.

In some embodiments, the second repeating units 16' are arranged in an array which includes first sub-arrays 16a of the second repeating units 16' and second sub-arrays 16b of the second repeating units 16'. The first sub-arrays 16a and the second sub-arrays 16b are separated from one another and alternately arranged in the X direction. In each of the first sub-arrays 16a and the second sub-arrays 16b, the second repeating units 16' are spaced apart from each other in the Y direction.

Figure 15A:
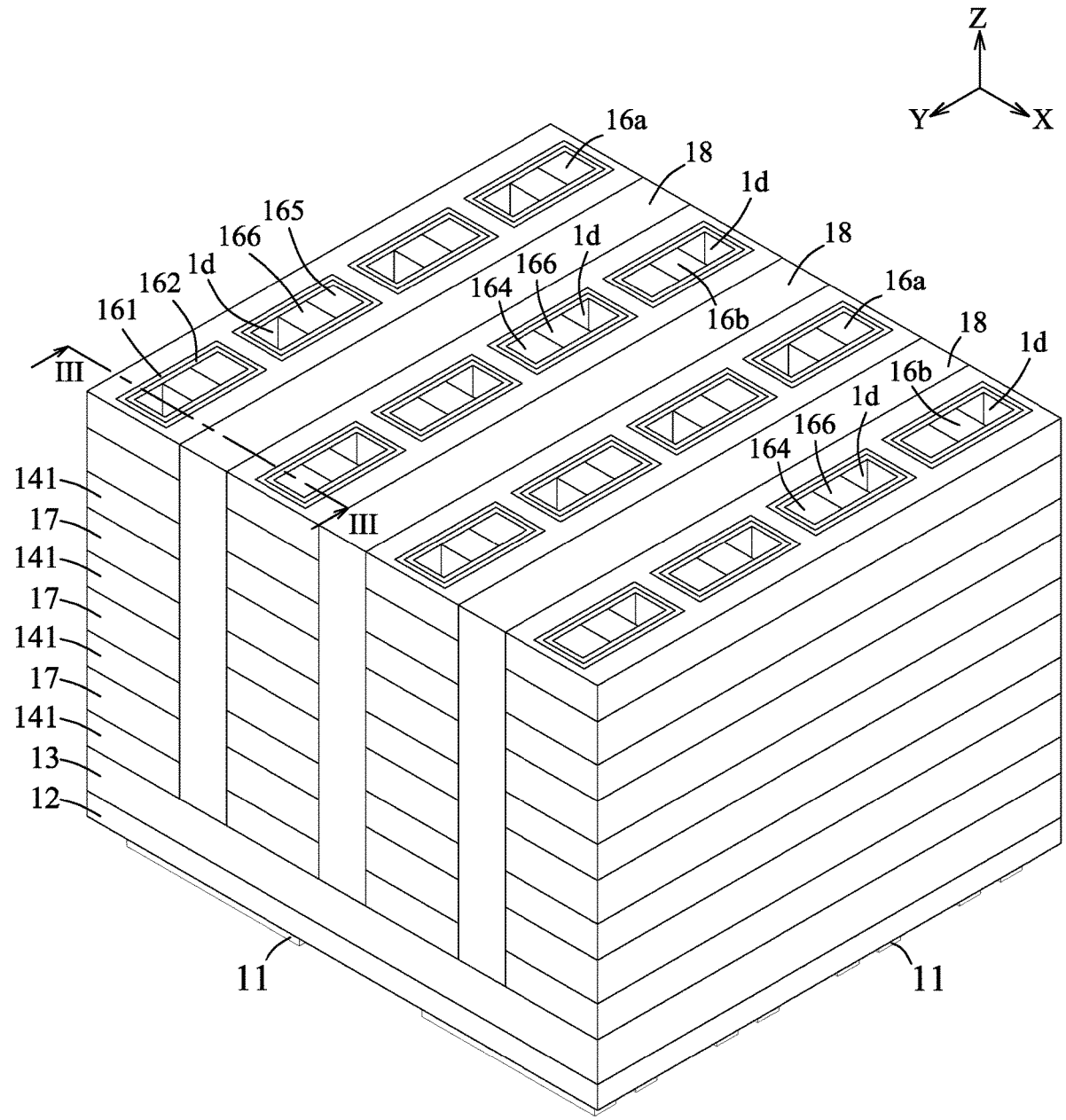
Figure 15B:
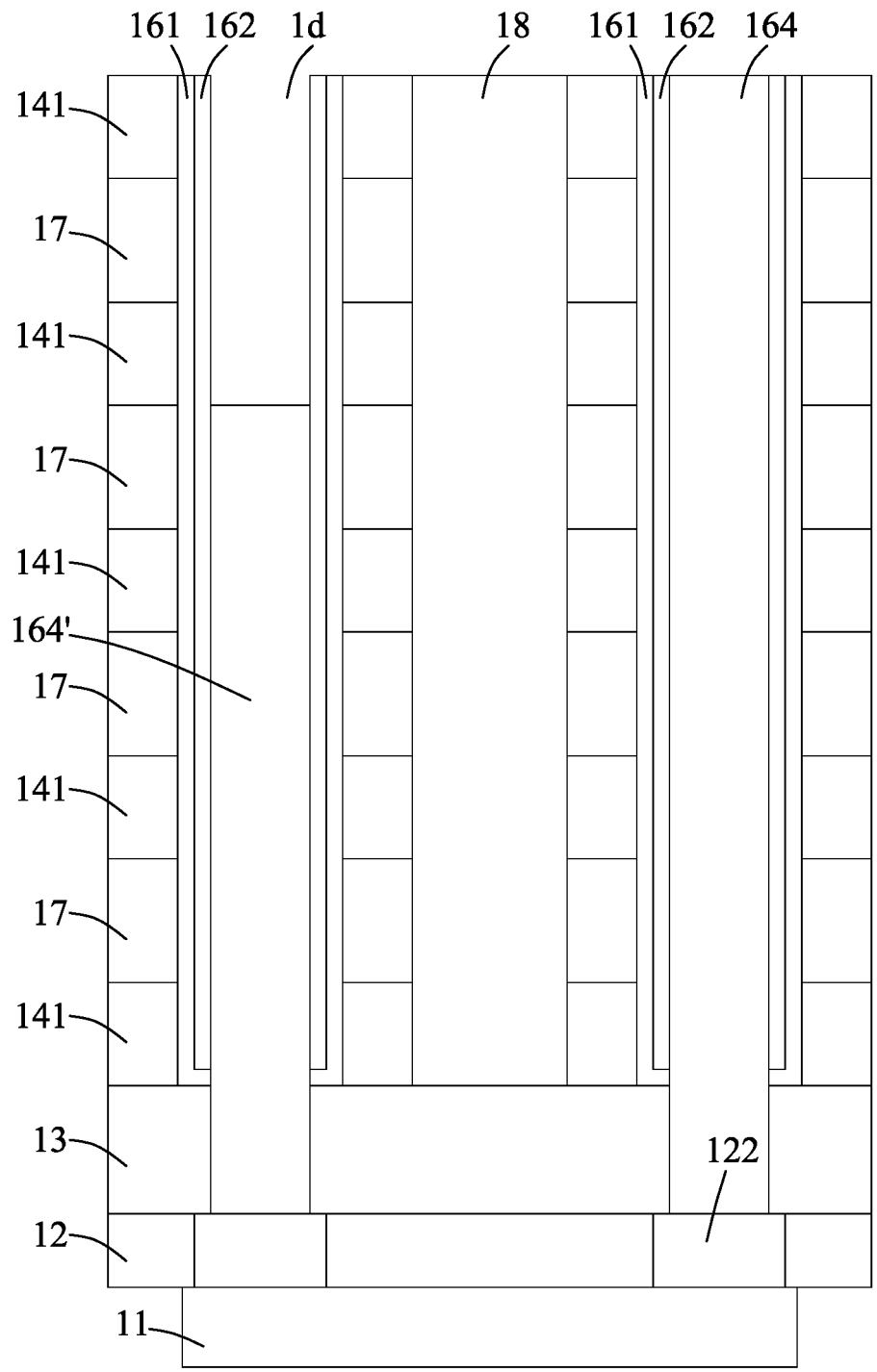

Referring to FIGS. 1B, 15A and 15B, the method 100 then proceeds to step 114, where the first conductive pillars 164 of the second repeating units 16' in the first sub-arrays 16a and the second conductive pillars 165 of the second repeating units 16' in the second sub-arrays 16b are partially etched to form a plurality of third recesses 1d. FIG. 15B illustrates a fragmentary cross-sectional view taken along line of FIG. 15A. As shown in FIG. 15B, upper surfaces of the etched first conductive pillars 164' in the first sub-arrays 16a and the etched second conductive pillars 165' in the second sub-arrays 16b are located at a level between an upper surface of the second uppermost one of the first dielectric layers 141 and a lower surface of the second uppermost one of the first dielectric layers 141. The second uppermost one of the first dielectric layers 141 is located beneath the first uppermost one of the first dielectric layers 141 that is most distal from the bottom IMD layer 12. Step 114 may be conducted by a suitable etching process, for example, but not limited to, dry etching, wet etching or a combination thereof. In some embodiments, the third recesses 1d may have different depths in the Z direction.

In some embodiments, each of the pairs of the bottom metal lines 11 corresponds to one of the first sub-arrays 16a and one of the second sub-arrays 16b that corresponds to the one of the first sub-arrays 16a. For each of the pairs of the bottom metal lines 11 and the one of the first sub-arrays 16a and the one of the second sub-arrays 16b that correspond thereto, one of the bottom metal lines 11 electrically connects a corresponding one of the etched first conductive pillars 164' of the one of the first sub-arrays 16a and a corresponding one of the first conductive pillars 164 of the one of the second sub-arrays 16b, and the other one of the bottom metal lines 11 electrically connects a corresponding one of the second conductive pillars 165 of the one of the first sub-arrays 16a and a corresponding one of the etched second conductive pillars 165' of the one of the second sub-arrays 16b.

Figure 16A:
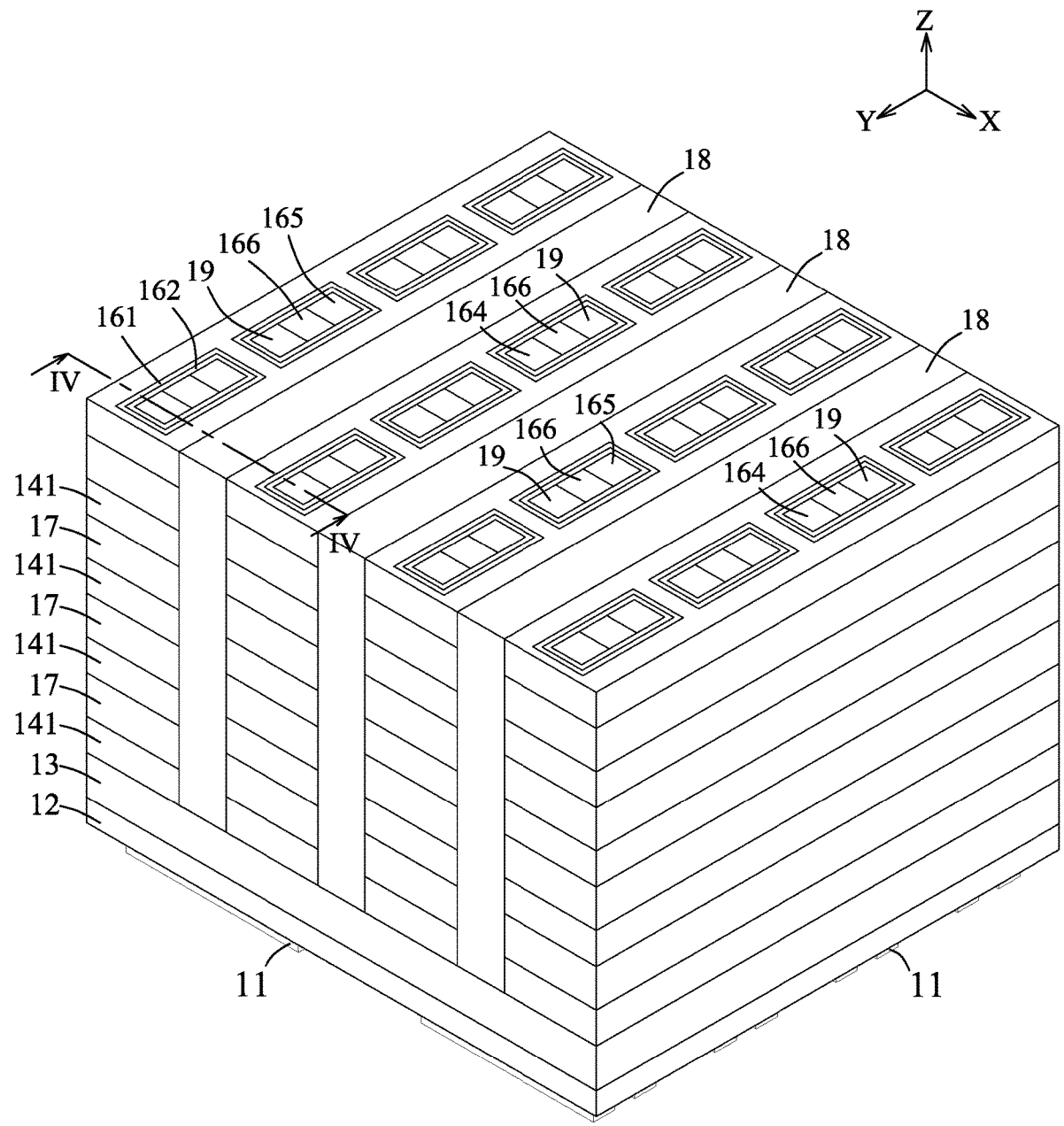
Figure 16B:
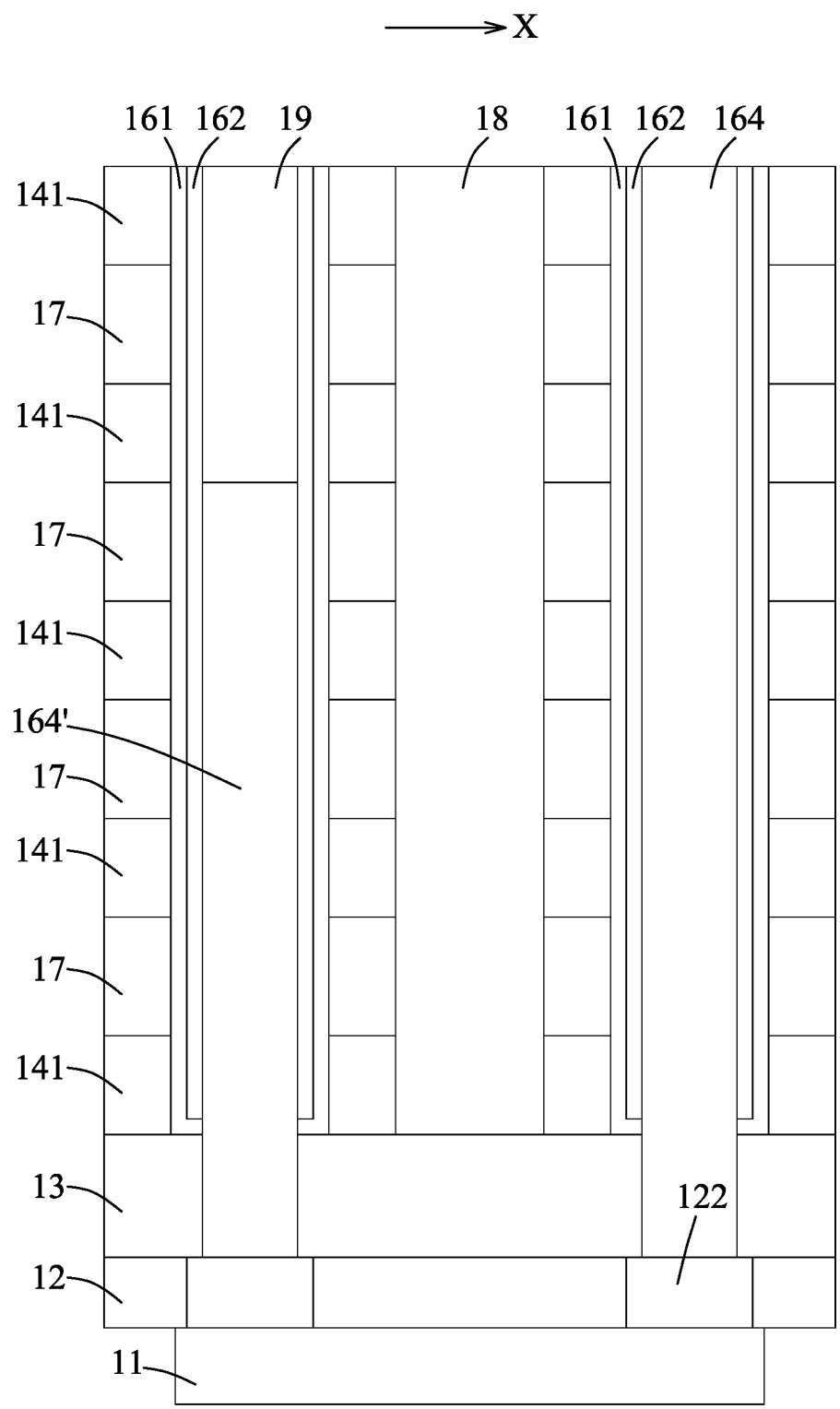

Referring to FIGS. 1B, 16A and 16B, the method 100 then proceeds to step 115, where a plurality of second insulating portions 19 are formed in the third recesses 1d, respectively. FIG. 16B illustrates a fragmentary cross-sectional view taken along line IV-IV of FIG. 16A. Step 115 may include (i) forming an insulating material layer over the structure shown in FIG. 15A so as to fill the third recesses 1d by a suitable deposition process (for example, but not limited to, CVD, PVD or other suitable deposition processes), and then (ii) conducting a planarization process (for example, but not limited to, CMP) to remove the insulating material layer above the structure shown in FIG. 15A, so as to obtain the second insulating portions 19 respectively disposed on the etched first conductive pillars 164' and the etched second conductive pillars 165'. The insulating material layer for the second insulating portions 19 may include, for example, but not limited to, silicon oxide, silicon nitride, silicon oxynitride, silicon oxycarbide, silicon carbonitride, and combinations thereof. Other suitable materials for the second insulating portion 19 are within the contemplated scope of the present disclosure.

Figure 17A:
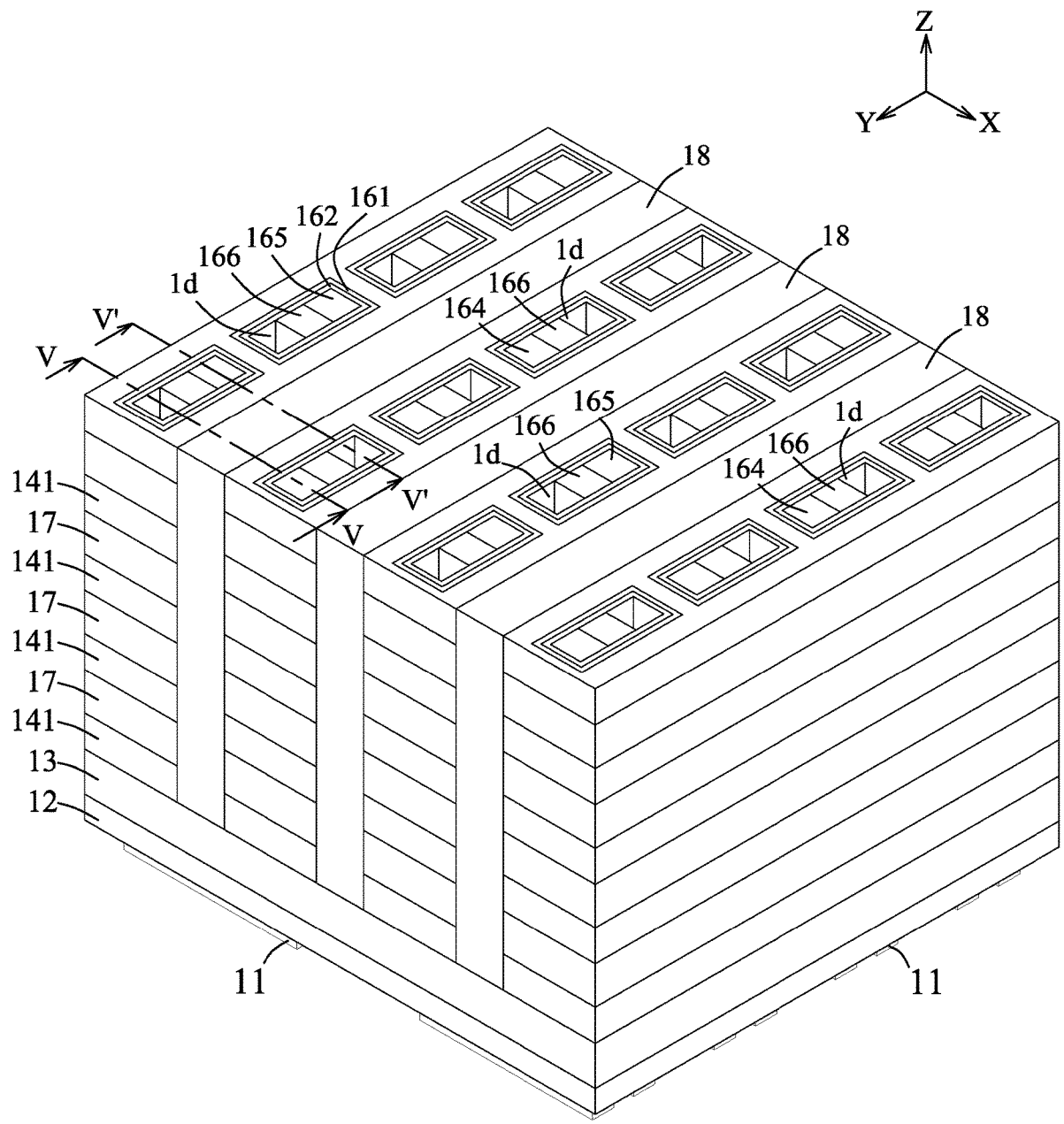
Figure 17B:
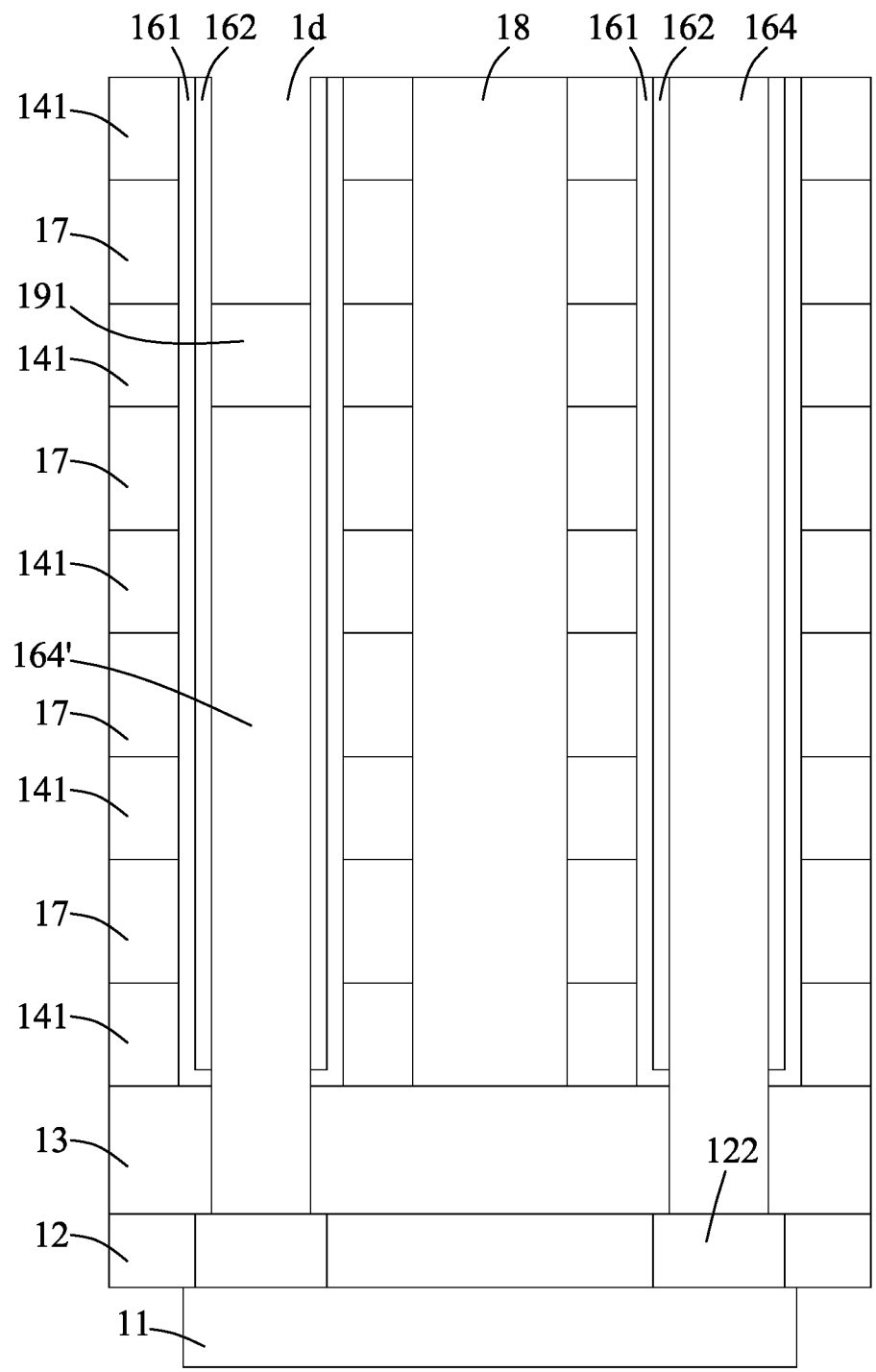
Figure 17C:
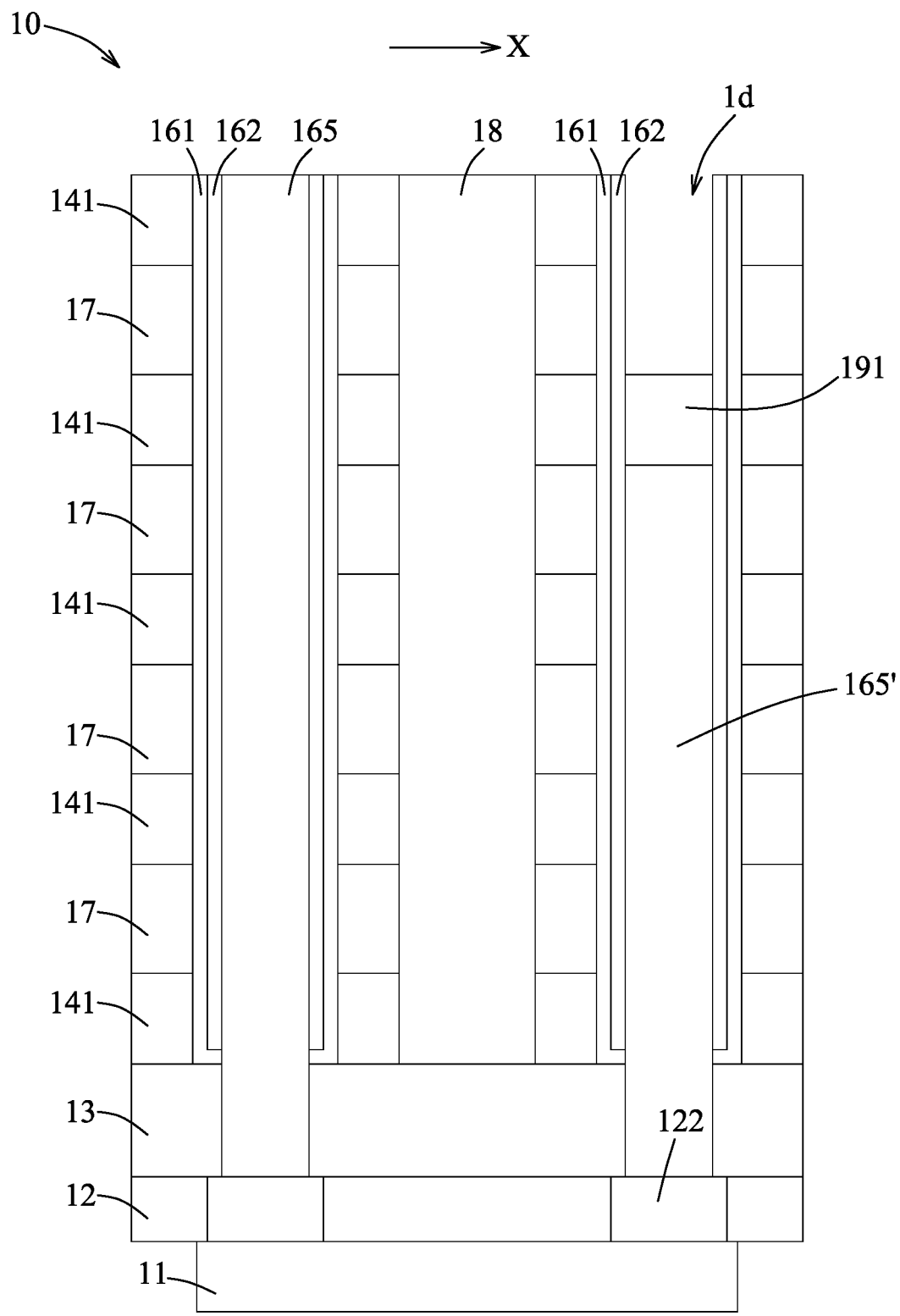

Referring to FIGS. 1B, 17A, 17B and 17C, the method 100 then proceeds to step 116, where the second insulating portions 19 are partially etched to form a plurality of isolators 191 in the third recesses 1d, respectively. FIG. 17B illustrates a fragmentary cross-sectional view taken along line V-V of FIG. 17A. FIG. 17C illustrates a fragmentary cross-sectional view taken along line V'-V' of FIG. 17A. The isolators 191 are disposed on the etched first conductive pillars 164' and the etched second conductive pillars 165', respectively. Step 116 may be conducted using a suitable etching technique, for example, dry etching, wet etching, or a combination thereof. In some embodiments, a lower surface of each of the isolators 191 may be located at a level that is not lower than the lower surface of the second uppermost one of the first dielectric layers 141 (i.e., higher than an upper surface of the second uppermost one of the conductive segments 17). In some embodiments, an upper surface of each of the isolators 191 may be located at a level that is lower than an upper surface of a first uppermost one of the conductive segments 17. The upper surface of the first uppermost one of the conductive segments 17 is connected to a lower surface of the first uppermost one of the first dielectric layers 141. The isolators 191 may have different heights in the Z direction.

Figure 18A:
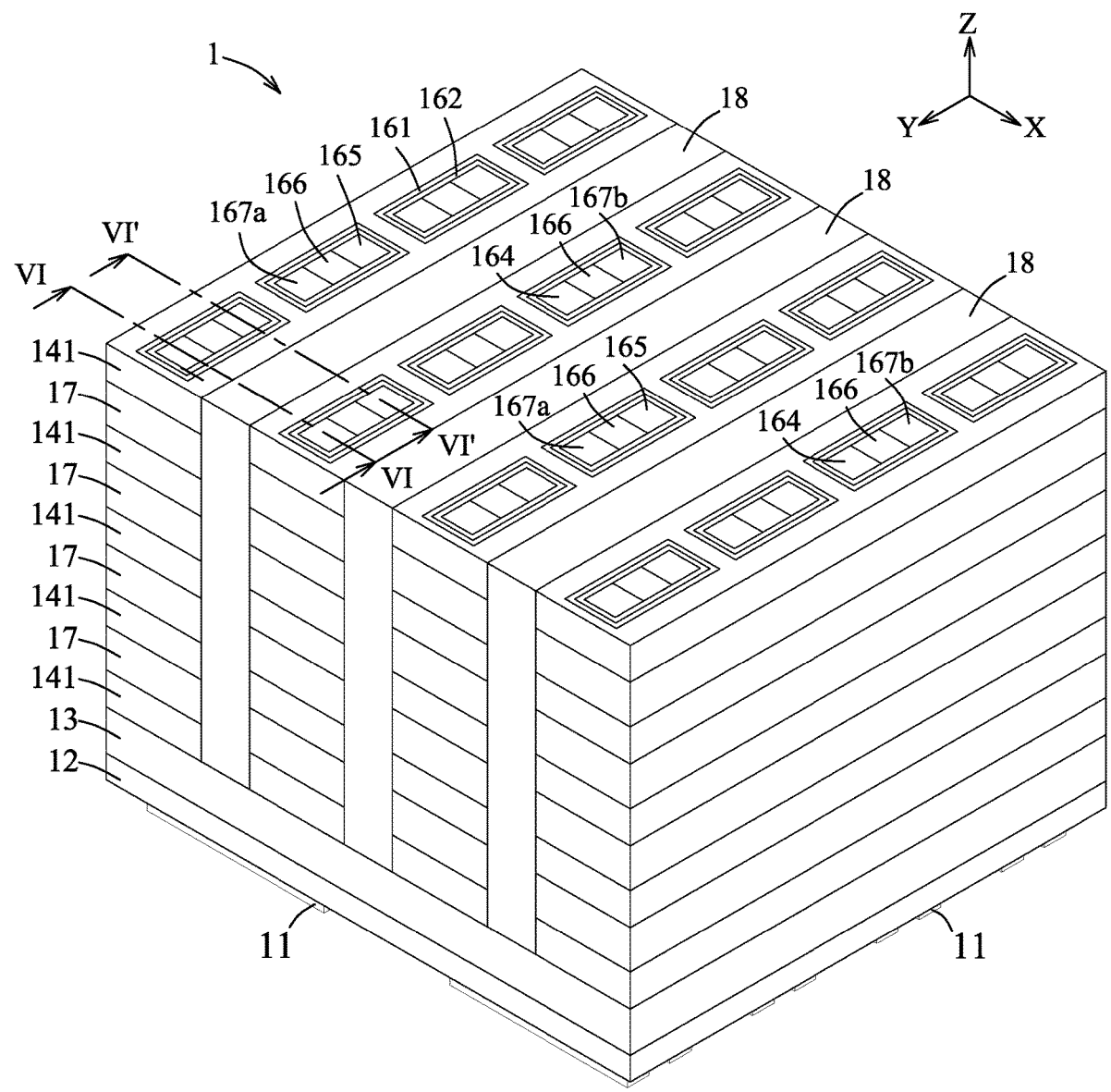
Figure 18B:
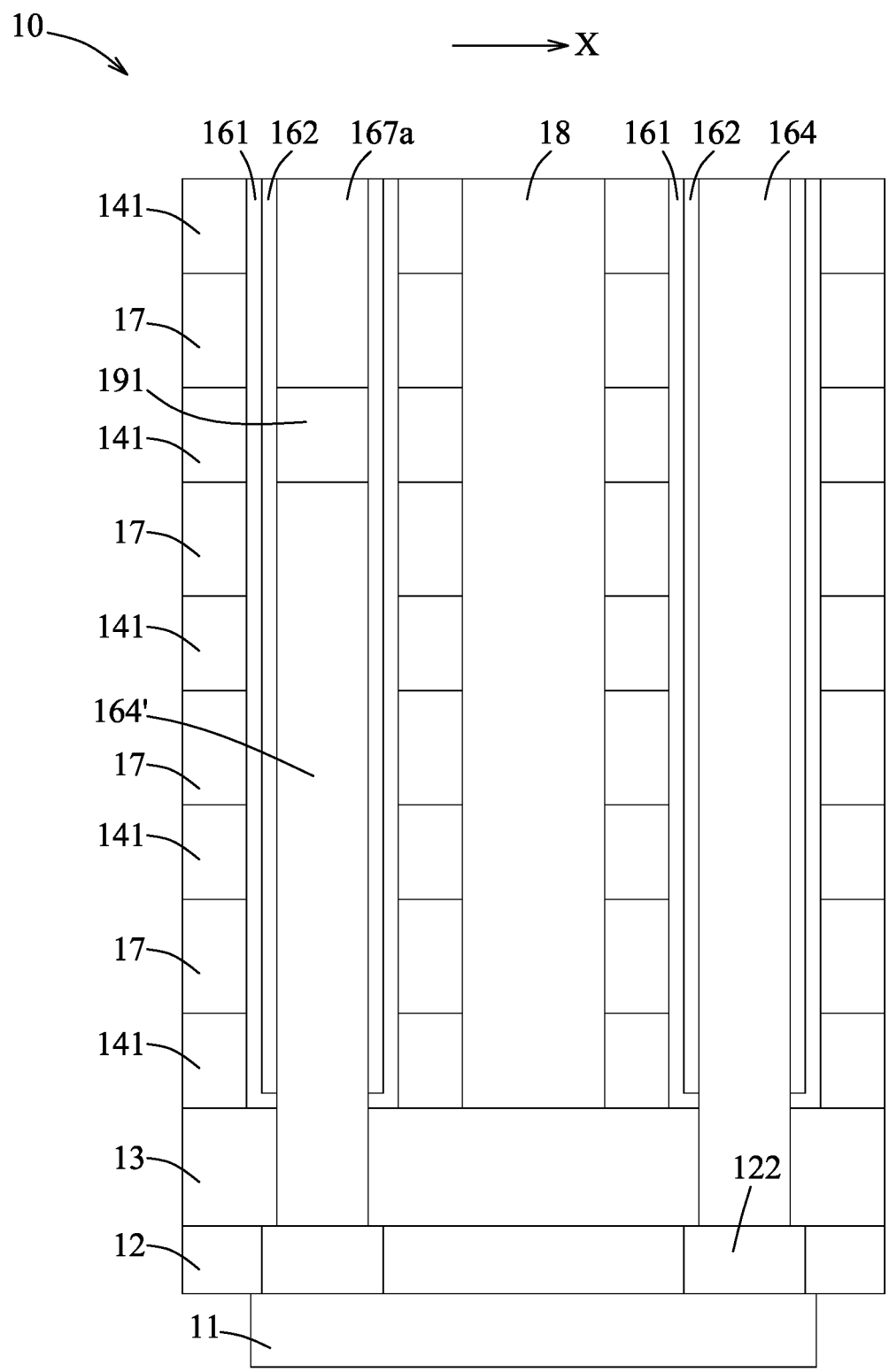
Figure 18C:
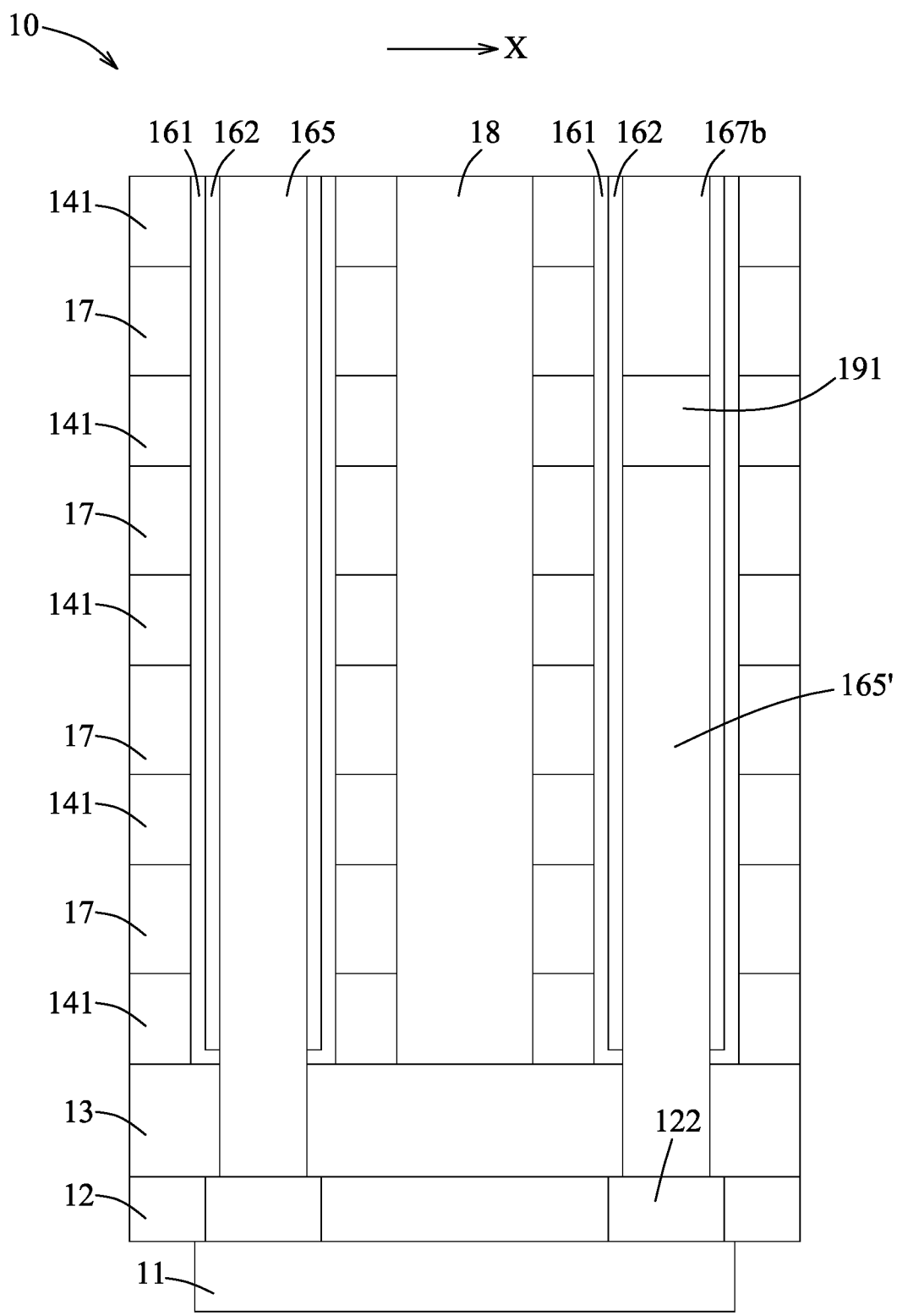

Referring to FIGS. 1B, 18A, 18B and 18C, the method 100 then proceeds to step 117, where a plurality of first conductive portions 167a and a plurality of second conductive portions 167b are formed in the third recesses 1d, respectively. FIG. 18B illustrates a fragmentary cross-sectional view taken along line VI-VI of FIG. 18A. FIG. 18C illustrates a fragmentary cross-sectional view taken along line VI'-VI' of FIG. 18A. Step 117 may include (i) forming a conductive material layer on the structure shown in FIG. 17A (or FIG. 17B) so as to fill the third recesses 1d by a suitable deposition process (for example, CVD, PVD, ALD or other suitable deposition processes), and then (ii) conducting a planarization process (for example, but not limited to, CMP) to remove the conductive material layer above the structure shown in FIG. 17A (or FIG. 17B), so as to obtain the first conductive portions 167a and the second conductive portions 167b in the third recesses 1d, respectively. Each of the first conductive portions 167a is disposed on a corresponding one of the isolators 191 opposite to a corresponding one of the etched first conductive pillars 164', and each of the second conductive portions 167b is disposed on a corresponding one of the isolators 191 opposite to a corresponding one of the etched second conductive pillars 165'. The conductive material layer for the first and second conductive portions 167a, 167b may include, for example, but not limited to, titanium nitride, tungsten, a combination thereof, or other suitable conductive materials. After formation of the first and second conductive portions 167a, 167b, the 3D memory structure 1 is obtained.

Figure 19A:
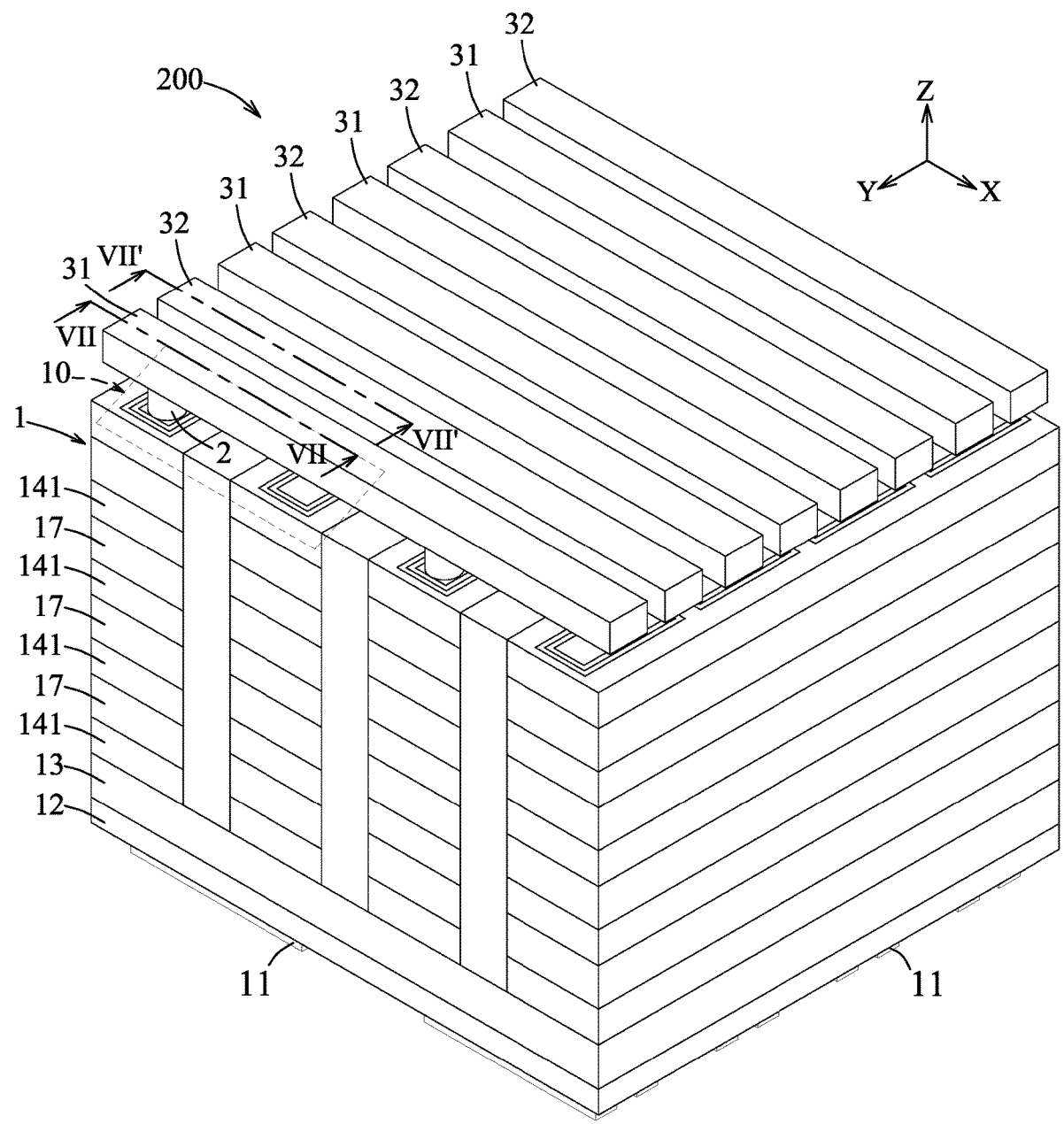
Figure 19B:
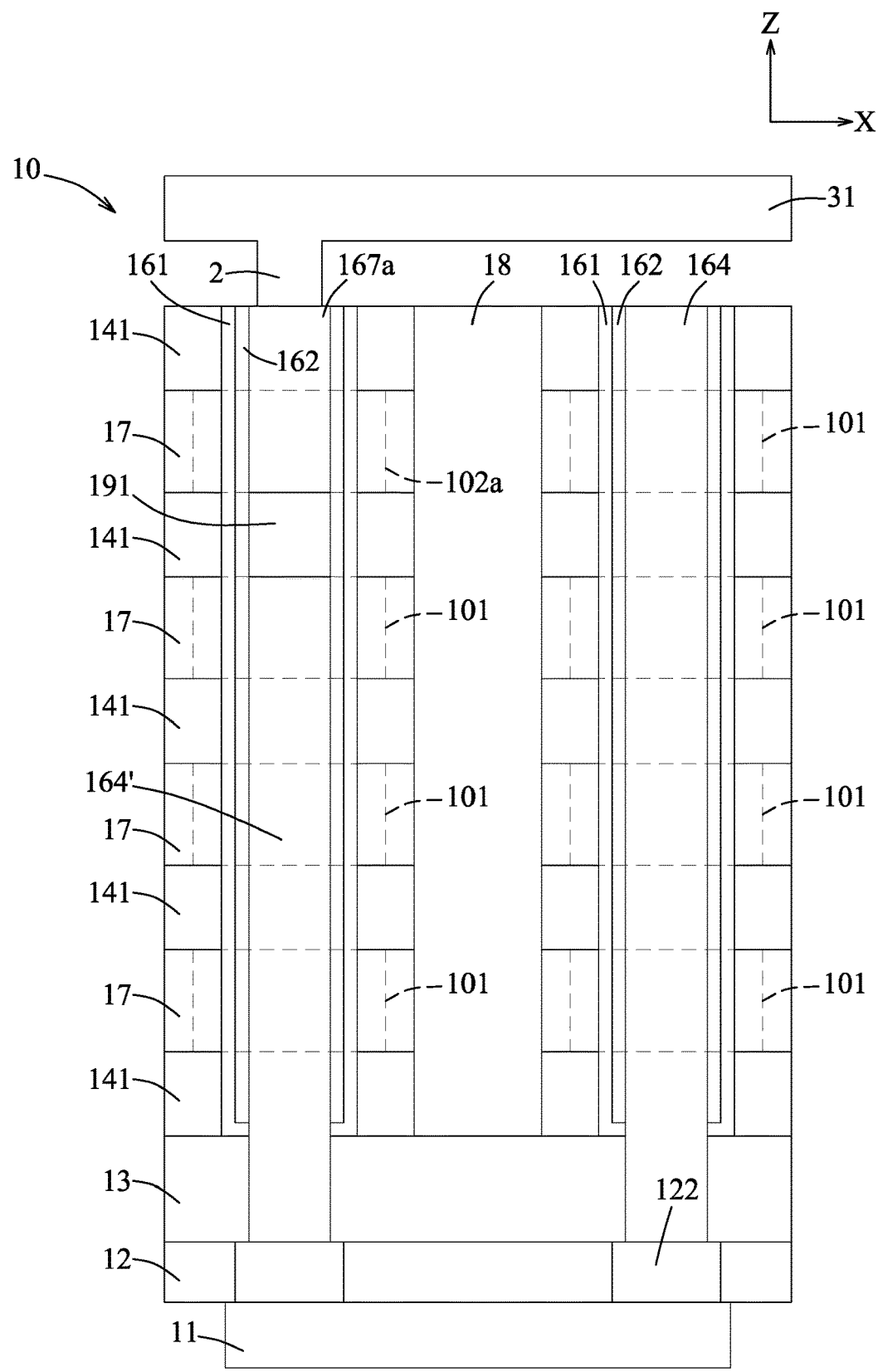
Figure 19C:
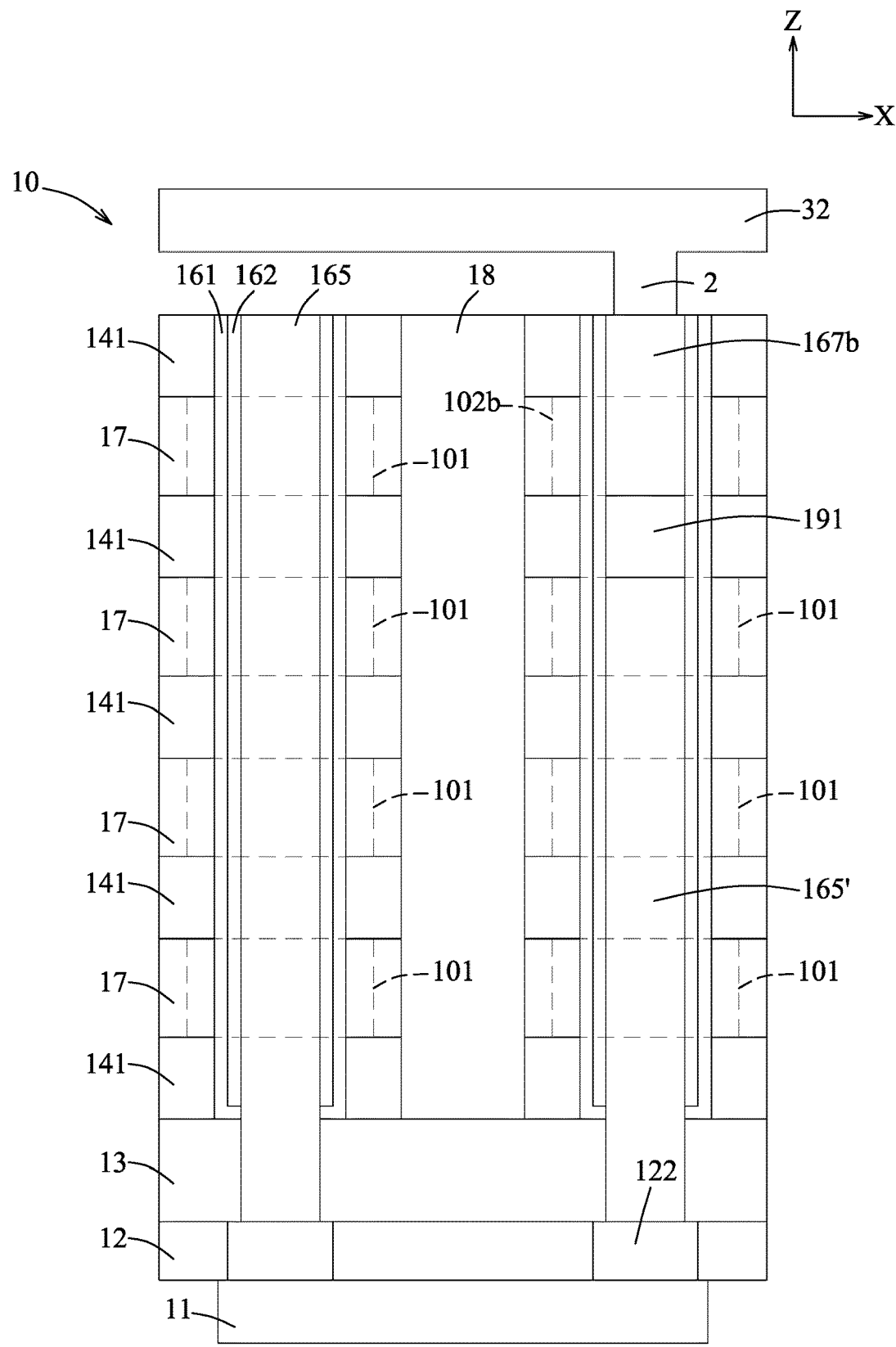

Referring to FIGS. 1B, 19A, 19B and 19C, the method 100 then proceeds to step 118, where a plurality of top via contacts 2 and a plurality of pairs of top metal lines 31, 32 are sequentially formed. FIG. 19B illustrates a fragmentary cross-sectional view taken along line VII-VII of FIG. 19A. FIG. 19C illustrates a fragmentary cross-sectional view taken along line VII'-VII' of FIG. 19A. The top via contacts 2 may be formed in a top inter-metal dielectric (IMD) layer (not shown) that is formed on the 3D memory structure 1. The material and process for forming the top via contacts 2 are the same as or similar to those for forming the bottom via contacts 12 as described in step 104, and thus details thereof are omitted for the sake of brevity. Each of the top via contacts 2 is disposed on a corresponding one of the first conductive portions 167a or a corresponding one of the second conductive portions 167b opposite to a corresponding one of the isolators 191. The pairs of the top metal lines 31, 32 may be formed in a dielectric layer and extend in the X direction. The material and process for forming the pairs of the top metal lines 31, 32 are the same as or similar to those for forming the bottom metal lines 11 as described in step 101, and thus details thereof are omitted for the sake of brevity. In some embodiments, the pairs of top metal lines 31, 32 are disposed at a side of the array of the second repeating units 16' (see FIG. 14A). In some embodiments, in each of the pairs of the top metal lines 31, 32, one of the top metal lines 31, 32 functions as a global bit line (GBL) and electrically connects the first conductive portions 167a of corresponding ones of the second repeating units 16' that are lined up with each other in the X direction (i.e., the second repeating units 16' arranged in the same row), and the other one of the top metal lines 31, 32 functions as a global source line (GSL) and electrically connects the second conductive portions 167b of the corresponding ones of the second repeating units 16' that are lined up with each other in the X direction. In the corresponding ones of the second repeating units 16', the etched first conductive pillars 164' and the first conductive pillars 164 serve as bit lines (BLs) and are electrically connected to the global bit line (GBL), and the etched second conductive pillars 165' and the second conductive pillars 165 serve as source lines (SLs) and are electrically connected to the global source line (GSL). After formation of the top via contacts 2 and the pairs of the top metal lines 31, 32, the semiconductor device 200 is obtained.

In some embodiments, the 3D memory structure 1 may include a plurality of memory arrays 10 (see FIGS. 19A, 19B and 19C). Each of the memory arrays 10 includes first and second sets of thin film transistors (TFTs) 101, a first switch transistor 102a, and a second switch transistor 102b. Each of the memory portions 161 has a plurality of memory regions which are displaced from one another in the Z direction, and each of the memory regions serves as a gate dielectric of the first switch transistor 102a, or the second switch transistor 102b or a corresponding one of the TFTs 101 in the first and second sets of the TFTs 101. Each of the channel portions 162 includes a plurality of channel regions which are displaced from one another in the Z direction, and each of the channel regions serves as a channel of the first switch transistor 102a, or the second switch transistor 102b or a corresponding one of the TFTs 101 in the first and second sets of the TFTs 101. Each of the first conductive pillars 164, the etched first conductive pillars 164', the second conductive pillars 165, and the etched second conductive pillars 165' includes a plurality of conductive regions which are displaced from one another in the Z direction, and each of the conductive regions serves as one of the source/drain electrodes or the other one of the source/drain electrodes of the first switch transistor 102a, or the second switch transistor 102b or a corresponding one of the TFTs 101 in the first and second sets of the TFTs 101. In some embodiments, the first and second sets of the TFTs 101 in each of the memory arrays 10 are electrically connected to each other by electrically connecting the etched first conductive pillar 164' and the second conductive pillar 165 with the first conductive pillar 164 and the etched second conductive pillar 165', respectively. In some embodiments, the etched first conductive pillar 164' in the first set of the TFTs 101 may be electrically connected to the first conductive pillar 164 in the second set of the TFTs 101 through a corresponding one of the bottom via contacts 122 and a corresponding one of the bottom metal lines 11; the second conductive pillar 165 in the first set of the TFTs 101 may be electrically connected to the etched second conductive pillar 165' in the second set of the TFTs 101 through a corresponding one of the bottom via contacts 122 and a corresponding one of the bottom metal lines 11. Each of the conductive segments 17 may serve as a word line for the first switch transistors 102a, the second switch transistors 102b, or a corresponding one of the TFTs 101 in the first and second sets of the TFTs 101. In some embodiments, the thickness of each of the word line for the first switch transistor 102a or the second switch transistor 102b may be the same as that of the word line of each of the TFTs 101 in the first and second sets of the TFTs 101. In some embodiments, in each of the memory arrays 10, the first conductive portion 167a serves as one of the source/drain electrodes of the first switch transistor 102a, and the second conductive portion 167b serves as one of the source/drain electrodes of the second switch transistor 102b.

Figure 20:
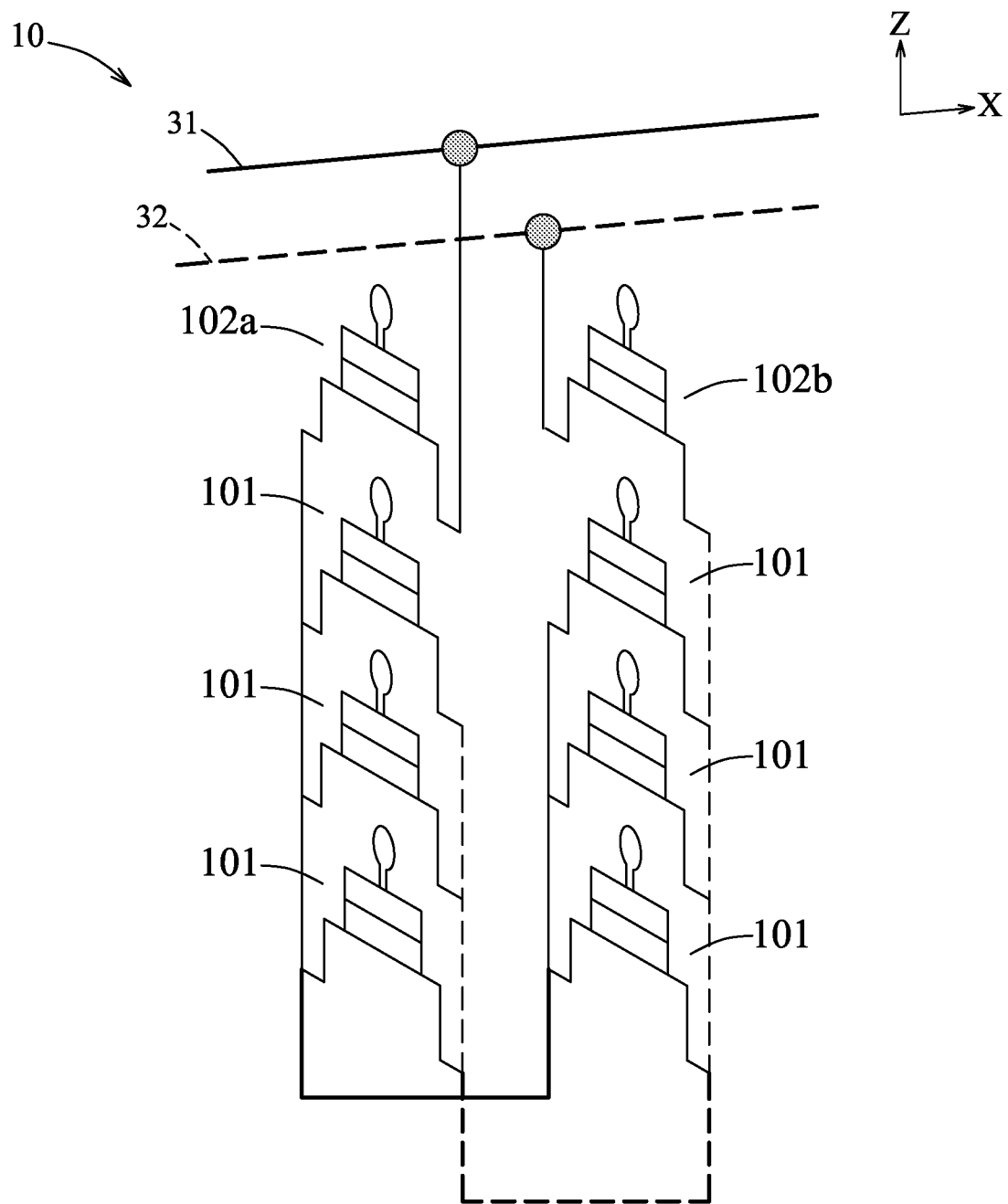
FIG. 20 is a circuit diagram of a memory array of the semiconductor memory device in accordance with some embodiments.

FIG. 20 is a circuit diagram of each of the memory arrays 10. The first and second sets of the TFTs 101 are spaced apart from each other in the X direction, and the TFTs 101 in the first and second sets are electrically connected to each other in parallel. The first switch transistor 102a is electrically connected in series to one of the TFTs 101 in the first set and one of the top metal lines 31 in a corresponding one of the pairs of the top metal lines 31, 32. The second switch transistor 102b is electrically connected in series to one of the TFTs 101 in the second set and the other one of the top metal lines 32 in the corresponding one of the pairs of the top metal lines 31, 32. In some embodiments, in the corresponding one of the pairs of the top metal lines 31, 32, the top metal line 31 is the GBL, and drain and source terminals of the first switch transistor 102a are electrically connected to the GBL and a drain terminal of the one of the TFTs 101 in the first set, respectively. Moreover, the top metal line 32 is the GSL, and drain and source terminals of the second switch transistor 102b are electrically connected to the GSL and a source terminal of the one of the TFTs 101 in the second set, respectively. In some embodiments, the first and second switch transistors 102a, 102b are respectively located above the first and second sets of the TFTs 101 in the Z direction.

In some embodiments, the first switch transistor 102a and the second switch transistor 102b in a selected one of the memory arrays 10 (i.e., selected memory array) may be switched on with the application of a suitable voltage, and the first switch transistor 102a and the second switch transistor 102b in other ones of the memory arrays 10 (i.e., unselected memory arrays 10) may be switched off without the application of a voltage. In such case, when a word line of one of the TFTs 101 in the selected ones of the memory arrays 10 is switched on with the application of a suitable voltage, the reading operation of the semiconductor memory device 200 may be affected mainly by a bit line capacitance and a source line capacitance of the selected memory array 10, and may not be affected by those of the nonselected memory arrays 10 due to the first switch transistor 102a and the second switch transistor 102b in each of the nonselected memory arrays 10 being switched off. As such, the resistive-capacitive (RC) delay of the semiconductor memory device 200 may be reduced due to a reduced parasitic capacitance, and the reading speed of the semiconductor memory device 200 may be improved.

Figure 21:
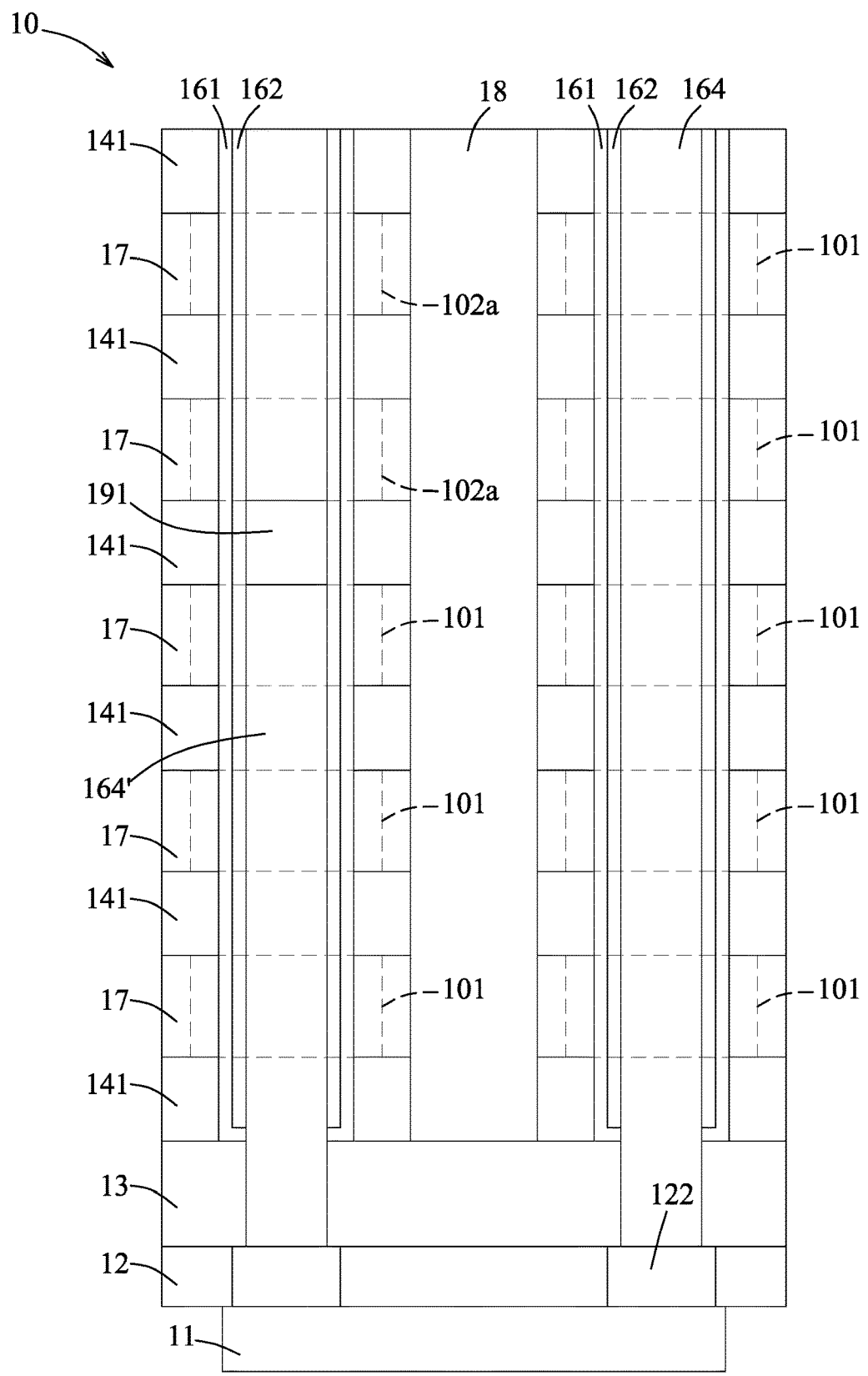
FIGS. 21 and 22 illustrate various examples of a memory array in accordance with some embodiments.

FIG. 21 illustrates, in accordance with some embodiments, each of the memory arrays 10 may have a plurality of the first switch transistors 102a which are electrically connected to each other in parallel. The first switch transistors 102a which are electrically connected to each other in parallel may have a lower resistance, which is conducive for increasing the reading speed of the semiconductor memory device 200 due to an increased current flow in each of the memory arrays 10. In some embodiments, each of the memory arrays 10 may have a plurality of the second switch transistors 102b which are electrically connected to each other in parallel.

Figure 22:
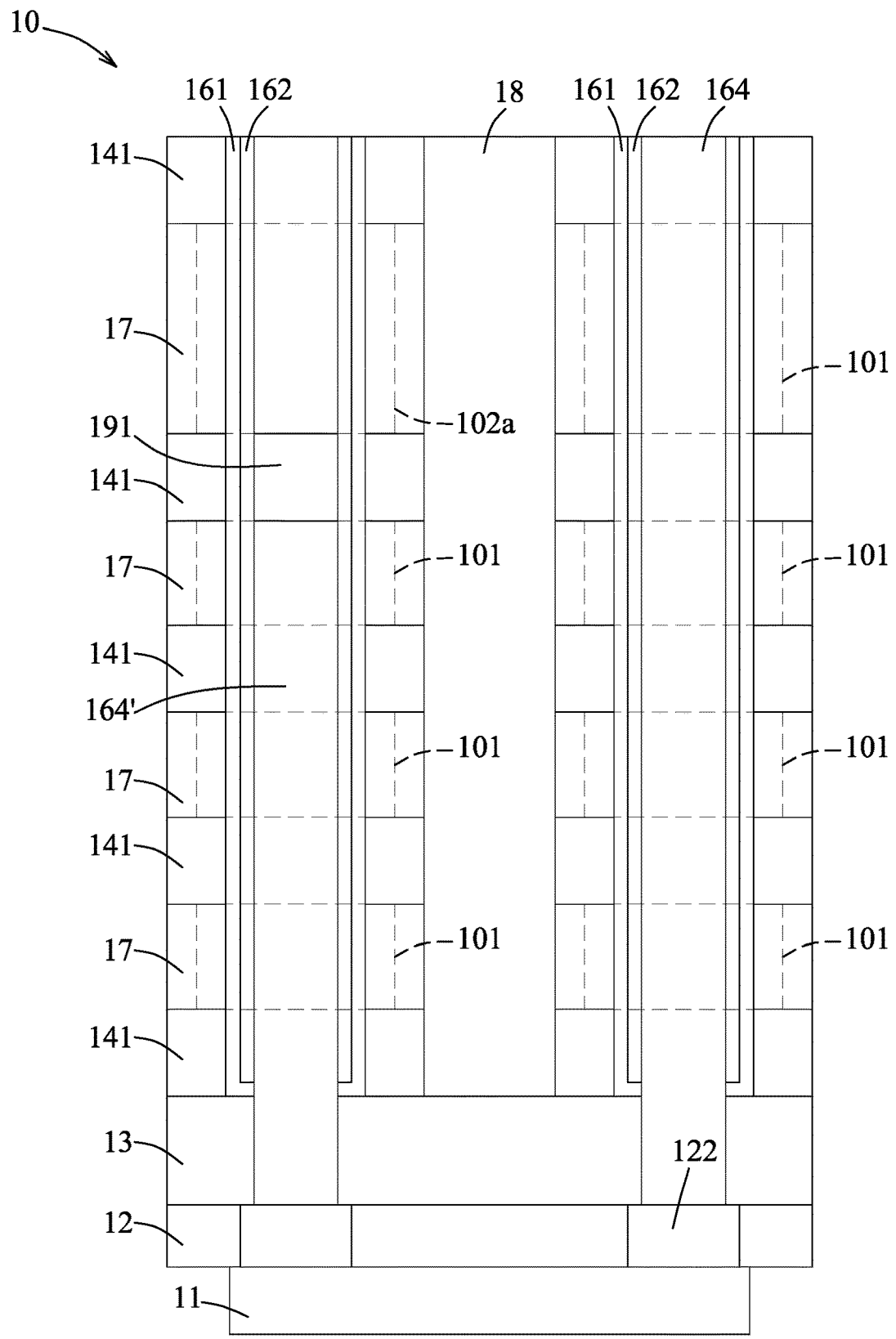

FIG. 22 illustrates, in accordance with some embodiments, the thickness of the word line of each of the first switch transistor 102a and the second switch transistor 102b (not shown) in each of the memory arrays 10 may be increased (for example, in a range from about 10 nm to about 500 nm), which is also conducive for reducing the resistance of the first switch transistor 102a and the second switch transistor 102b due to an increased channel width.

In this disclosure, by having the first and second switch transistors which are electrically connected in series to corresponding ones of the TFTs in the first and second sets in each of the memory arrays, respectively, when the first and second switch transistors in the selected memory array are switched on while the first and second switch transistors in the nonselected memory arrays are switched off, the semiconductor memory device may have a reduced parasitic capacitance, thereby reducing the RC delay of the semiconductor memory device and improving the reading speed of the semiconductor memory device. In addition, by electrically connecting the first and second sets of the TFTs that are arranged in a same side in each of the memory arrays through corresponding ones of the bottom via contacts and the bottom metal lines, the memory array capacity of the semiconductor memory device may be effectively increased.

In accordance with some embodiments of the present disclosure, a method for manufacturing a semiconductor memory device includes: forming an array of repeating units which includes first sub-arrays of the repeating units and second sub-arrays of the repeating units, the first sub-arrays and the second sub-arrays being separated from one another and alternately arranged in a first direction, each of the repeating units including a first conductive pillar and a second conductive pillar which are spaced apart from each other by an isolation pillar in a second direction transverse to the first direction and which extend upwardly in a third direction transverse to the first direction and the second direction, for each of the first sub-arrays and a corresponding adjacent one of the second sub-arrays, each of the first conductive pillars of the first sub-array being electrically connected to a corresponding one of the first conductive pillars of the corresponding adjacent one of the second sub-arrays, and each of the second conductive pillars of the first sub-array being electrically connected to a corresponding one of the second conductive pillars of the corresponding adjacent one of the second sub-arrays; partially etching the first conductive pillars of the repeating units in the first sub-arrays and the second conductive pillars of the repeating units in the second sub-arrays; forming a plurality of insulating portions on the etched first conductive pillars and the etched second conductive pillars, respectively; partially etching the insulating portions to form a plurality of isolators on the etched first conductive pillars and the etched second conductive pillars, respectively; and forming a plurality of first conductive portions and a plurality of second conductive portions, each of the first conductive portions being disposed on a corresponding one of the isolators opposite to a corresponding one of the etched first conductive pillars, each of the second conductive portions being disposed on a corresponding one of the isolators opposite to a corresponding one of the etched second conductive pillars.

In accordance with some embodiments of the present disclosure, each of the insulating portions and the isolator includes silicon oxide, silicon nitride, silicon oxynitride, silicon oxycarbide, silicon carbonitride, or combinations thereof.

In accordance with some embodiments of the present disclosure, each of the first conductive pillar, the second conductive pillar, the first conductive portion, and the second conductive portion includes titanium nitride or tungsten In accordance with some embodiments of the present disclosure, a method for manufacturing a semiconductor memory device further includes: after the step of forming the first conductive portions and the second conductive portions, forming a plurality of pairs of top metal lines that are disposed at a side of the array of the repeating units, that extend in the first direction and that are spaced apart from each other in the second direction, for each of the pairs of the top metal lines, one of the top metal lines electrically connecting corresponding ones of the first conductive portions that are lined up with each other in the first direction, the other one of the top metal lines electrically connecting corresponding ones of the second conductive portions that are lined up with each other in the first direction.

In accordance with some embodiments of the present disclosure, in each of the pairs of the top metal lines, the one of the top metal lines is a global bit line (GBL), and the other one of the top metal lines is a global source line (GSL), the etched first conductive pillars and the first conductive pillars serving as bit lines (BLs), the etched second conductive pillars and the second conductive pillars serving as source lines (SLs).

In accordance with some embodiments of the present disclosure, a method for manufacturing a semiconductor memory device further includes: before the step of forming the array of repeating units, forming a plurality of pairs of bottom metal lines that extend in the first direction and that are spaced apart from each other in the second direction, each of the pairs of the bottom metal lines corresponding to one of the first sub-arrays and one of the second sub-arrays that corresponds to the one of the first sub-arrays, for each of the pairs of the bottom metal lines and the one of the first sub-arrays and the one of the second sub-arrays that correspond thereto, one of the bottom metal lines electrically connecting a corresponding one of the etched first conductive pillars of the one of the first sub-arrays and a corresponding one of the first conductive pillars of the one of the second sub-arrays, and the other one of the bottom metal lines in the pair electrically connecting a corresponding one of the second conductive pillars of the one of the first sub-arrays and a corresponding one of the etched second conductive pillars of the one of the second sub-arrays.

In accordance with some embodiments of the present disclosure, a method for manufacturing a semiconductor memory device further includes: before the step of forming the array of repeating units, forming a multi-layer stack that includes a plurality of dielectric layers and a plurality of conductive segments that are alternately stacked in the third direction, the array of the repeating units extending through the multi-layer stack.

In accordance with some embodiments of the present disclosure, an upper surface of each of the isolators is located at a level that is lower than an upper surface of the first uppermost one of the conductive segments, and a lower surface of each of the isolators is located at a level that is higher than an upper surface of the second uppermost one of the conductive segments.

In accordance with some embodiments of the present disclosure, a semiconductor memory device includes a plurality of memory array. Each of the memory arrays includes first and second stack units, a separator, a first conductive unit, a second conductive unit, and two isolators. Each of first and second stack units includes a plurality of conductive segments and a plurality of dielectric segments which are alternately stacked on one another in a stack direction. The separator separates the first and second stack units in a first direction transverse to the stack direction. The first conductive unit includes a first conductive pillar, an etched first conductive pillar, and a first conductive portion. The first conductive pillar extends through the first stack unit. The etched first conductive pillar extends in the second stack unit, is spaced apart from the first conductive pillar in the first direction, and is electrically connected to the first conductive pillar. The first conductive portion is disposed on the etched first conductive pillar. The second conductive unit includes a second conductive pillar, an etched second conductive pillar, and a second conductive portion. The second conductive pillar extends through the second stack unit, and is spaced apart from the etched first conductive pillar in a second direction transverse to the first direction and the stack direction. The etched second conductive pillar extends in the first stack unit, is spaced apart from each of the second conductive pillar in the first direction and the first conductive pillar in the second direction, and is electrically connected to the second conductive pillar. The second conductive portion is disposed on the etched second conductive pillar. Two isolators are respectively disposed in the first and second stack units. One of the isolators is disposed between the first conductive portion and the etched first conductive pillar, and the other one of the isolators is disposed between the second conductive portion and the etched second conductive pillar.

In accordance with some embodiments of the present disclosure, each of the separator and the isolator includes silicon oxide, silicon nitride, silicon oxynitride, silicon oxycarbide, silicon carbonitride, or combinations thereof.

In accordance with some embodiments of the present disclosure, each of the first conductive pillar, the etched first conductive pillar, the second conductive pillar, the etched second conductive pillar, the first conductive portion, and the second conductive portion includes titanium nitride or tungsten.

In accordance with some embodiments of the present disclosure, the semiconductor memory device further includes a plurality of pairs of top metal lines that are disposed at a side of the memory arrays, that extend in the first direction, and that are spaced apart from each other in the second direction. For each of the pairs of the top metal lines, one of the top metal lines is electrically connected to corresponding ones of the first conductive portions that are lined up with each other in the first direction, and the other one of the top metal lines is electrically connected to corresponding ones of the second conductive portions that are lined up with each other in the first direction.

In accordance with some embodiments of the present disclosure, in each of the pairs of the top metal lines, the one of the top metal lines is a global bit line (GBL), and the other one of the top metal lines is a global source line (GSL). The etched first conductive pillars and the first conductive pillars serve as bit lines (BLs). The etched second conductive pillars and the second conductive pillars serve as source lines (SLs).

In accordance with some embodiments of the present disclosure, the semiconductor memory device further includes a plurality of pairs of bottom metal lines that extend in the first direction and that are spaced apart from each other in the second direction. In each of the pairs of the bottom metal lines, one of the bottom metal lines electrically connects the etched first conductive pillar and the first conductive pillar of a corresponding one of the memory arrays, and the other one of the bottom metal lines electrically connects the etched second conductive pillar and the second conductive pillar of the corresponding one of the memory arrays.

In accordance with some embodiments of the present disclosure, each of the memory arrays further includes two channel portions that extend in the stack direction, and that respectively surround the first conductive unit and the second conductive unit.

In accordance with some embodiments of the present disclosure, each of the memory arrays further includes two of memory portions that extend in the stack direction, and that respectively surround the channel portions.

In accordance with some embodiments of the present disclosure, a semiconductor memory device includes a plurality of pairs of metal lines and a plurality of memory arrays. The pairs of the metal lines extend in a first direction and are spaced apart from each other in a second direction transverse to the first direction. Each of the memory arrays includes first and second sets of thin film transistors (TFTs), a first switch transistor, and a second switch transistor. The first and second sets of the TFTs are spaced apart from each other in the first direction. The TFTs in the first and second sets of the TFTs are electrically connected to each other in parallel. The first switch transistor is electrically connected in series to one of the TFTs in the first set of the TFTs and one of the metal lines in a corresponding one of the pairs of the metal lines. The second switch transistor is electrically connected in series to one of the TFTs in the second set of the TFTs and the other one of the metal lines in the corresponding one of the pairs of the metal lines.

In accordance with some embodiments of the present disclosure, the one of the metal lines in the corresponding one of the pairs of the metal lines is a global bit line (GBL), and the other one of the metal lines in the corresponding one of the pairs of the metal lines is a global source line (GSL).

In accordance with some embodiments of the present disclosure, drain and source terminals of the first switch transistor are electrically connected to the GBL of the corresponding one of the pairs of the metal lines and a drain terminal of the one of the TFTs in the first set of the TFTs, respectively, and drain and source terminals of the second switch transistor are electrically connected to the GSL of the corresponding one of the pairs of the metal lines and a source terminal of the one of the TFTs in the second set of the TFTs, respectively.

In accordance with some embodiments of the present disclosure, the pairs of the metal lines are located above the memory arrays in a third direction transverse to the first direction and the second direction.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor memory device, comprising:
forming an array of repeating units which includes first sub-arrays of the repeating units and second sub-arrays of the repeating units, the first sub-arrays and the second sub-arrays being separated from one another and alternately arranged in a first direction, each of the repeating units including a first conductive pillar and a second conductive pillar which are spaced apart from each other by an isolation pillar in a second direction transverse to the first direction and which extend upwardly in a third direction transverse to the first direction and the second direction, for each of the first sub-arrays and a corresponding adjacent one of the second sub-arrays, each of the first conductive pillars of the first sub-array being electrically connected to a corresponding one of the first conductive pillars of the corresponding adjacent one of the second sub-arrays, and each of the second conductive pillars of the first sub-array being electrically connected to a corresponding one of the second conductive pillars of the corresponding adjacent one of the second sub-arrays;
partially etching the first conductive pillars of the repeating units in the first sub-arrays and the second conductive pillars of the repeating units in the second sub-arrays;
forming a plurality of insulating portions on the etched first conductive pillars and the etched second conductive pillars, respectively;
partially etching the insulating portions to form a plurality of isolators on the etched first conductive pillars and the etched second conductive pillars, respectively; and
forming a plurality of first conductive portions and a plurality of second conductive portions, each of the first conductive portions being disposed on a corresponding one of the isolators opposite to a corresponding one of the etched first conductive pillars, each of the second conductive portions being disposed on a corresponding one of the isolators opposite to a corresponding one of the etched second conductive pillars.

2. The method of claim 1, wherein each of the insulating portions and the isolator includes silicon oxide, silicon nitride, silicon oxynitride, silicon oxycarbide, silicon carbonitride, or combinations thereof.

3. The method of claim 1, wherein each of the first conductive pillar, the second conductive pillar, the first conductive portion, and the second conductive portion includes titanium nitride or tungsten.

4. The method of claim 1, further comprising, after the step of forming the first conductive portions and the second conductive portions, forming a plurality of pairs of top metal lines that are disposed at a side of the array of the repeating units, that extend in the first direction and that are spaced apart from each other in the second direction, for each of the pairs of the top metal lines, one of the top metal lines electrically connecting corresponding ones of the first conductive portions that are lined up with each other in the first direction, the other one of the top metal lines electrically connecting corresponding ones of the second conductive portions that are lined up with each other in the first direction.

5. The method of claim 4, wherein,
in each of the pairs of the top metal lines, the one of the top metal lines is a global bit line (GBL), and the other one of the top metal lines is a global source line (GSL), the etched first conductive pillars and the first conductive pillars serving as bit lines (BLs), the etched second conductive pillars and the second conductive pillars serving as source lines (SLs).

6. The method of claim 1, further comprising, before the step of forming the array of repeating units, forming a plurality of pairs of bottom metal lines that extend in the first direction and that are spaced apart from each other in the second direction,
each of the pairs of the bottom metal lines corresponding to one of the first sub-arrays and one of the second sub-arrays that corresponds to the one of the first sub-arrays,
for each of the pairs of the bottom metal lines and the one of the first sub-arrays and the one of the second sub-arrays that correspond thereto, one of the bottom metal lines electrically connecting a corresponding one of the etched first conductive pillars of the one of the first sub-arrays and a corresponding one of the first conductive pillars of the one of the second sub-arrays, and the other one of the bottom metal lines in the pair electrically connecting a corresponding one of the second conductive pillars of the one of the first sub-arrays and a corresponding one of the etched second conductive pillars of the one of the second sub-arrays.

7. The method of claim 1, further comprising, before the step of forming the array of repeating units, forming a multi-layer stack that includes a plurality of dielectric layers and a plurality of conductive segments that are alternately stacked in the third direction, the array of the repeating units extending through the multi-layer stack.

8. The method of claim 7, wherein an upper surface of each of the isolators is located at a level that is lower than an upper surface of the first uppermost one of the conductive segments, and a lower surface of each of the isolators is located at a level that is higher than an upper surface of the second uppermost one of the conductive segments.

9. A method for manufacturing a semiconductor memory device, comprising:
forming a first dielectric stack region and a second dielectric stack region separated from each other in a first direction;
forming an array of repeating units which includes a first sub-array of the repeating units and a second sub-array of the repeating units respectively penetrating the first dielectric stack region and the second dielectric stack region, each of the repeating units including a first conductive pillar and a second conductive pillar which are spaced apart from each other by an isolation pillar in a second direction transverse to the first direction, and which extend upwardly in a third direction transverse to the first direction and the second direction, each of the first conductive pillars of the first sub-array being electrically connected to a corresponding one of the first conductive pillars of the second sub-array, and each of the second conductive pillars of the first sub-array being electrically connected to a corresponding one of the second conductive pillars of the second sub-array;
partially etching the first conductive pillars of the repeating units in the first sub-array and the second conductive pillars of the repeating units in the second sub-array;
forming a plurality of insulating portions on the etched first conductive pillars and the etched second conductive pillars, respectively;

partially etching the insulating portions to form a plurality of isolators on the etched first conductive pillars and the etched second conductive pillars, respectively; and forming a plurality of first conductive portions and a plurality of second conductive portions, each of the first conductive portions being disposed on a corresponding one of the isolators opposite to a corresponding one of the etched first conductive pillars, each of the second conductive portions being disposed on a corresponding one of the isolators opposite to a corresponding one of the etched second conductive pillars.

10. The method of claim 9, further comprising, before formation of the repeating units, forming the first dielectric stack region and the second dielectric stack region on an etch stop layer, the first conductive pillar and the second conductive pillar of each of the repeating units further penetrating the etch stop layer.

11. The method of claim 10, further comprising, forming a plurality of metal lines below the etch stop layer and opposite to the first dielectric stack region and the second dielectric stack region, the plurality of the metal lines extending in the first direction and being spaced apart from one another in the second direction, each of the etched first conductive pillars penetrating the etch stop layer and being electrically connected to a corresponding one of the plurality of the metal lines, each of the etched second conductive pillars penetrating the etch stop layer and being electrically connected to a corresponding one of the plurality of the metal lines.

12. The method of claim 10, wherein the isolation pillar of each of the repeating units terminates at an upper surface of the etch stop layer.

13. The method of claim 10, wherein each of the repeating units is further formed with a channel portion that is disposed on the etch stop layer, and that surrounds the first conductive pillar, the second conductive pillar, and the isolation pillar.

14. The method of claim 13, wherein each of the repeating units is further formed with a memory portion that is disposed on the etch stop layer, and that surrounds the channel portion.

15. A method for manufacturing a semiconductor memory device, comprising:

forming a first dielectric stack region and a second dielectric stack region spaced apart from each other by a recess in a first direction;

forming a separator in the recess;

forming an array of repeating units which includes a first sub-array of the repeating units and a second sub-array of the repeating units respectively penetrating the first dielectric stack region and the second dielectric stack region, and being separated from each other by the separator, each of the repeating units including a first conductive pillar and a second conductive pillar which are spaced apart from each other by an isolation pillar in a second direction transverse to the first direction, and which extend upwardly in a third direction transverse to the first direction and the second direction, each of the first conductive pillars of the first sub-array being electrically connected to a corresponding one of the first conductive pillars of the second sub-array, and each of the second conductive pillars of the first sub-array being electrically connected to a corresponding one of the second conductive pillars of the second sub-array;

partially etching the first conductive pillars of the repeating units in the first sub-array and the second conductive pillars of the repeating units in the second sub-array;

forming a plurality of insulating portions on the etched first conductive pillars and the etched second conductive pillars, respectively;

partially etching the insulating portions to form a plurality of isolators on the etched first conductive pillars and the etched second conductive pillars, respectively; and forming a plurality of first conductive portions and a plurality of second conductive portions, each of the first conductive portions being disposed on a corresponding one of the isolators opposite to a corresponding one of the etched first conductive pillars, each of the second conductive portions being disposed on a corresponding one of the isolators opposite to a corresponding one of the etched second conductive pillars.

16. The method of claim 15, wherein the separator includes silicon oxide, silicon nitride, silicon oxynitride, silicon oxycarbide, silicon carbonitride, or combinations thereof.

17. The method of claim 15, further comprising, before formation of the repeating units, forming an array of insulating portions which includes a first sub-array of the insulating portions and a second sub-array of the insulating portions, the first sub-array of the insulating portions and the second sub-array of the insulating portions respectively penetrating the first dielectric stack region and the second dielectric stack region in the third direction, and being separated from one another by the separator in the first direction;

patterning the insulating portions such that each of the insulating portions is formed into the isolation pillar of the each of the repeating units, and two through holes that are isolated from each other by the isolation pillar of the each of the repeating units; and forming a conductive material layer to fill the through holes, so as to obtain the first conductive pillar and the second conductive pillar of the each of the repeating units.

18. The method of claim 17, further comprising, before formation of the insulating portions, forming an array of channel portions which includes a first sub-array of the channel portions and a second sub-array of the channel portions, the first sub-array of the channel portions and the second sub-array of the channel portions respectively penetrating the first dielectric stack region and the second dielectric stack region in the third direction, and being separated from one another by the separator in the first direction, each of the channel portions in the first sub-array of the channel portions surrounding a corresponding one of the insulating portions in the first sub-array of the insulating portions, each of the channel portions in the second sub-array of the channel portions surrounding a corresponding one of the insulating portions in the second sub-array of the insulating portions.

19. The method of claim 18, further comprising forming an array of memory portions which includes a first sub-array of the memory portions and a second sub-array of the memory portions, the first sub-array of the memory portions and the second sub-array of the memory portions respectively penetrating the first dielectric stack region and the second dielectric stack region in the third direction, and being separated from one another by the separator in the first direction, each of the memory portions in the first sub-array of the memory portions surrounding a corresponding one of the channel portions in the first sub-array of the channel portions, each of the memory portions in the second sub-array of the memory portions surrounding a corresponding one of the channel portions in the second sub-array of the channel portions.

20. The method of claim 15, wherein each of the first dielectric stack region and a second dielectric stack region includes a plurality of dielectric layers and a plurality of conductive segments that are alternately stacked in the third direction.

* * * * *